(12) United States Patent
Liu et al.

(10) Patent No.: US 11,710,929 B2
(45) Date of Patent: Jul. 25, 2023

(54) TERMINAL MODULE AND BACKPLANE CONNECTOR HAVING THE TERMINAL MODULE

(71) Applicant: Dongguan Luxshare Technologies Co., Ltd, Dongguan (CN)

(72) Inventors: Xiaogang Liu, Dongguan (CN); Rongzhe Guo, Dongguan (CN); Kun Liu, Dongguan (CN); Chuanqi Gong, Dongguan (CN); Tao Song, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 206 days.

(21) Appl. No.: 17/340,309

(22) Filed: Jun. 7, 2021

(65) Prior Publication Data

US 2021/0399483 A1    Dec. 23, 2021

(30) Foreign Application Priority Data

Jun. 19, 2020   (CN) .......................... 202010567796.4
Dec. 28, 2020  (CN) .......................... 202023230734.9

(51) Int. Cl.
*H01R 13/648*    (2006.01)
*H01R 13/6471*   (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/724; H01R 12/585; H01R 12/716; H01R 12/71; H01R 12/712;
(Continued)

(56) References Cited

U.S. PATENT DOCUMENTS 4,601,527 A    7/1986  Lemke
5,664,968 A    9/1997  Mickievicz
(Continued)

FOREIGN PATENT DOCUMENTS

CN    1244959 A    2/2000
CN    2513252 Y    9/2002
(Continued)

*Primary Examiner* — Khiem M Nguyen
(74) *Attorney, Agent, or Firm* — Birch, Stewart, Kolasch & Birch, LLP

(57) ABSTRACT

A terminal module includes a number of conductive terminals. The conductive terminals include a first signal terminal and a second signal terminal. A contact portion of the first signal terminal includes a first contact arm, a second contact arm and a first clamping space. The first contact arm includes a first contact end portion and a first contact arm body portion connected with the first contact end portion. The first contact arm body portion includes a first end connected to the first contact end portion and a second end opposite to the first end. From the first end to the second end, a width of the first contact arm body portion gradually increases. As a result, it is beneficial to improve the contact impedance when it is mated with a mating backplane connector. The present disclosure also discloses a backplane connector having the terminal module.

18 Claims, 25 Drawing Sheets

(51) Int. Cl.

| | |
|---|---|
| *H01R 13/40* | (2006.01) |
| *H01R 13/6587* | (2011.01) |
| *H01R 13/6591* | (2011.01) |
| *H01R 13/514* | (2006.01) |
| *H01R 13/518* | (2006.01) |
| *H01R 12/72* | (2011.01) |
| *H01R 13/6586* | (2011.01) |
| *H01R 12/58* | (2011.01) |
| *H05K 1/11* | (2006.01) |
| *H01R 13/6588* | (2011.01) |
| *H01R 13/6583* | (2011.01) |
| *H01R 13/6585* | (2011.01) |
| *H01R 13/6582* | (2011.01) |
| *H01R 43/24* | (2006.01) |
| *H01R 12/71* | (2011.01) |
| *H01R 13/20* | (2006.01) |
| *H01R 13/504* | (2006.01) |
| *H01R 13/6461* | (2011.01) |
| *H01R 13/6584* | (2011.01) |
| *H05K 3/30* | (2006.01) |
| *H01R 13/02* | (2006.01) |
| *H05K 3/34* | (2006.01) |
| *H01R 13/6474* | (2011.01) |
| *H01R 13/502* | (2006.01) |
| *H01R 13/46* | (2006.01) |
| *H01R 13/646* | (2011.01) |
| *H01R 13/6473* | (2011.01) |
| *H01R 13/6581* | (2011.01) |

(52) U.S. Cl.
    CPC ........... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
    CPC .............. H01R 12/722; H01R 13/6581; H01R 13/6473; H01R 13/646; H01R 13/46; H01R 13/502; H01R 13/02; H01R 13/6471; H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115; H05K 3/306; H05K 3/3447; H05K 2201/1078; H05K 2201/10189; H05K 2201/09236; H05K 2201/10371; H05K 2201/10871

USPC .................................................... 439/607.08
See application file for complete search history.

(56) References Cited

U.S. PATENT DOCUMENTS

| | | |
|---|---|---|
| 9,350,126 B2 | 5/2016 | Little et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |
| 2019/0044284 A1 | 2/2019 | Dunham |
| 2021/0399483 A1* | 12/2021 | Liu ............... H01R 13/6471 |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 181158354 | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 183311746 A | 9/2013 |
| CN | 203288874 U | 11/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105812664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |

(56) References Cited

FOREIGN PATENT DOCUMENTS

| | | |
|---|---|---|
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | 201733225 A | 9/2017 |
| TW | I600231 B | 9/2017 |
| TW | 201810825 A | 3/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 231943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

\* cited by examiner

TERMINAL MODULE AND BACKPLANE CONNECTOR HAVING THE TERMINAL MODULE

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202023230734.9, filed on Dec. 28, 2020 and titled "TERMINAL MODULE AND BACKPLANE CONNECTOR HAVING THE TERMINAL MODULE", the entire content of which is incorporated herein by reference.

TECHNICAL FIELD

The present disclosure relates to a terminal module and a backplane connector, which belongs to a technical field of connectors.

BACKGROUND

Existing backplane connectors usually include a header and a plurality of terminal modules assembled to the housing. Each terminal module includes an insulating frame, a plurality of conductive terminals insert-molded with the insulating frame, and a metal shield disposed on at least one side of the insulating frame. The conductive terminals generally include signal terminals and ground terminals. The signal terminals include contact arms for mating with mating terminals.

However, with the continuous improvement of signal transmission requirements for high-speed connectors, there is still room for improvement in the design of existing contact arms.

SUMMARY

An object of the present disclosure is to provide a terminal module and a backplane connector with improved contact impedance.

In order to achieve the above object, the present disclosure adopts the following technical solution: a terminal module comprising: a plurality of conductive terminals, each conductive terminal comprising a contact portion and a connection portion electrically connected to the contact portion, the conductive terminals comprising differential signal terminals, a first ground terminal and a second ground terminal; the differential signal terminals being located between the first ground terminal and the second ground terminal, the differential signal terminals comprising a first signal terminal and a second signal terminal; and an insulating frame, the connection portions of the conductive terminals being fixed to the insulating frame, the insulating frame comprising a hollow portion to which the connection portions of the conductive terminals are partially exposed, the contact portions of the differential signal terminals protruding beyond the insulating frame; wherein the contact portion of the first signal terminal comprises a first contact arm, a second contact arm opposite to the first contact arm, and a first clamping space located between the first contact arm and the second contact arm; the first contact arm comprises a first contact end portion and a first contact arm body portion connected with the first contact end portion; the first contact arm body portion comprises a first end connected to the first contact end portion and a second end disposed opposite to the first end; and wherein from the first end to the second end, a width of the first contact arm body portion gradually increases.

In order to achieve the above object, the present disclosure adopts the following technical solution: a backplane connector comprising: a header defining a receiving space for receiving a mating backplane connector; and a plurality of terminal modules assembled to the header, each terminal module comprising: a plurality of conductive terminals, each conductive terminal comprising a contact portion and a connection portion electrically connected to the contact portion, the conductive terminals comprising differential signal terminals, a first ground terminal and a second ground terminal; the differential signal terminals being located between the first ground terminal and the second ground terminal, the differential signal terminals comprising a first signal terminal and a second signal terminal; and an insulating frame, the connection portions of the conductive terminals being fixed to the insulating frame, the insulating frame comprising a hollow portion to which the connection portions of the conductive terminals are partially exposed, the contact portions of the differential signal terminals protruding beyond the insulating frame; wherein the contact portion of the first signal terminal comprises a first contact arm, a second contact arm opposite to the first contact arm, and a first clamping space located between the first contact arm and the second contact arm; the first contact arm comprises a first contact end portion and a first contact arm body portion connected with the first contact end portion; the first contact arm body portion comprises a first end connected to the first contact end portion and a second end disposed opposite to the first end; and from the first end to the second end, a width of the first contact arm body portion gradually increases; and wherein the contact portions of the conductive terminals protrude into the receiving space.

Compared with the prior art, the width of the first contact arm body portion of the present disclosure gradually increases from the first end to the second end, which is beneficial to improve the contact impedance when mating with a mating backplane connector.

DETAILED DESCRIPTION

Figure 1:
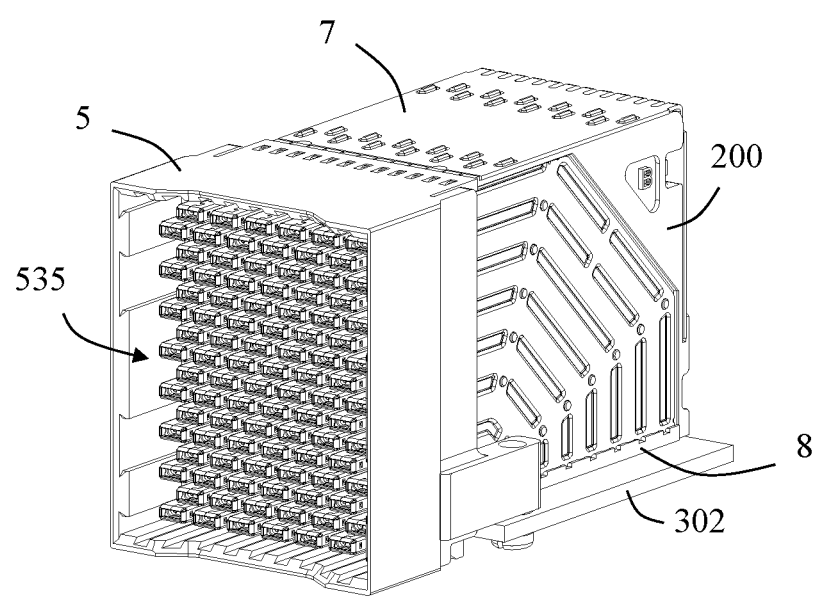
FIG. 1 is a perspective schematic view of a backplane connector mounted on a circuit board in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
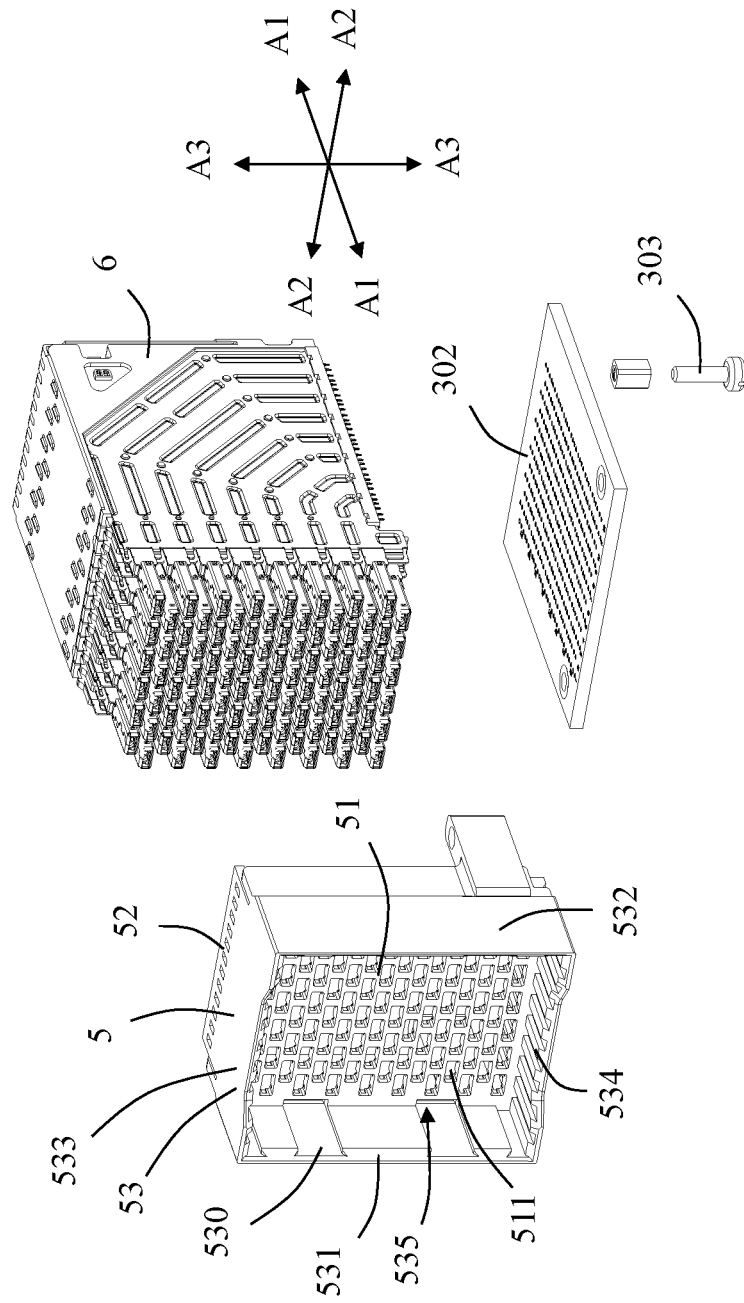
FIG. 2 is a partial exploded view of FIG. 1.

Referring to FIGS. 1 and 2, an illustrated embodiment of the present disclosure discloses a backplane connector 200 for being mounted on a circuit board 302. In the illustrated embodiment of the present disclosure, the backplane connector 200 is fixed to the circuit board 302 by a bolt 303. The backplane connector 200 is adapted for mating with a mating backplane connector (not shown) for high-speed data transmission.

Figure 3:
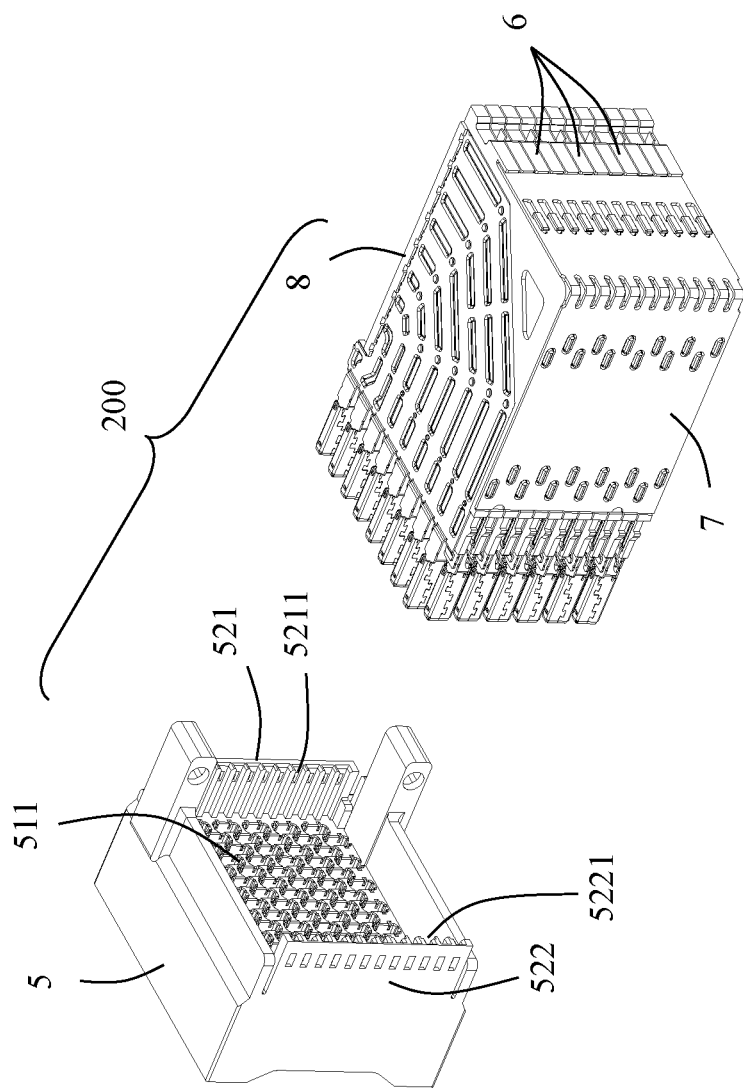
FIG. 3 is a partial exploded view of the backplane connector in FIG. 2 from another angle.

Referring to FIGS. 2 and 3, the backplane connector 200 includes a header 5, a plurality of terminal modules 6 assembled to the header 5, a spacer 7 holding on one side of the plurality of terminal modules 6, and a mounting block 8 holding the other side of the plurality of terminal modules 6.

Figure 4:
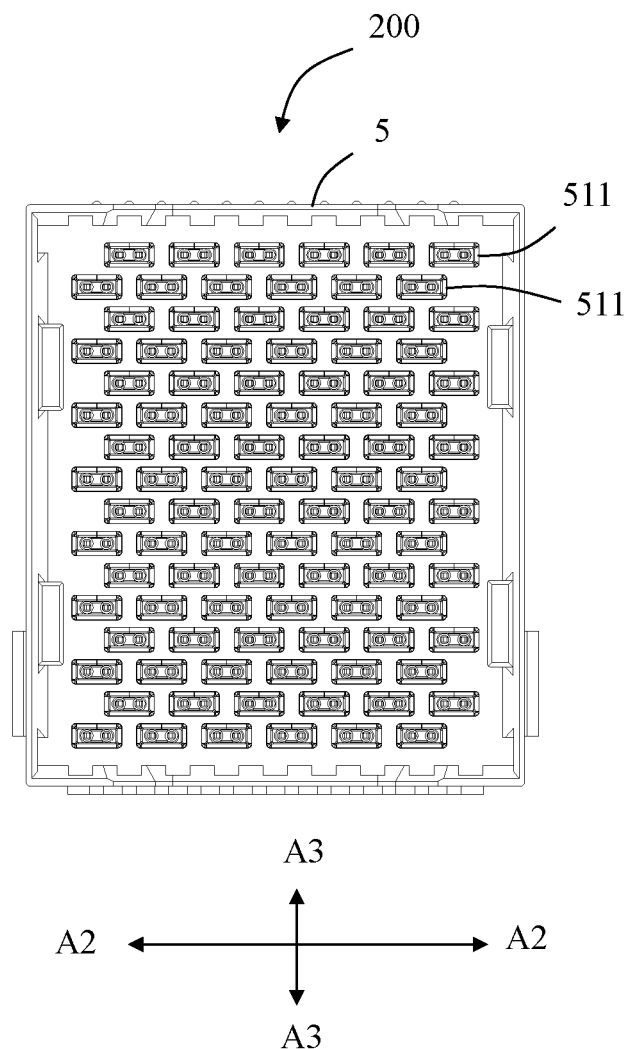
FIG. 4 is a front view of the backplane connector in FIG. 1.

The header 5 is made of insulating material. The header 5 includes a body portion 51, a wall portion 52 extending from the body portion 51 to one end (for example, extending forwardly), and a frame portion 53 extending from the body portion 51 to the other end (for example, extending rearwardly). The body portion 51 includes a plurality of terminal receiving grooves 511 extending along a first direction A1-A1 (for example, a front-rear direction). Referring to FIG. 4, in the illustrated embodiment of the present disclosure, the terminal receiving grooves 511 are disposed in multiple rows along a second direction A2-A2 (for example, a left-right direction). Two adjacent rows of terminal receiving grooves 511 are staggered in a third direction A3-A3 (for example, a top-bottom direction). That is, in two adjacent rows of the terminal receiving grooves 511, the terminal receiving grooves 511 at corresponding positions are not in alignment with each other in the second direction A2-A2. The wall portion 52 includes a first wall portion 521 and a second wall portion 522 disposed opposite to each other. The first wall portion 521 includes a plurality of first slots 5211. The second wall portion 522 includes a plurality of second slots 5221. The first slot 5211 and the second slot 5221, which are in alignment with each other, together with the terminal receiving groove 511 corresponding to the first slot 5211 and the second slot 5221 are jointly used for receiving the same terminal module 6.

The frame portion 53 includes a first extension wall 531, a second extension wall 532 opposite to the first extension wall 531, a top wall 533 connecting one end of the first extension wall 531 and one end of the second extension wall 532, a bottom wall 534 connecting the other end of the first extension wall 531 and the other end of the second extension wall 532, and a receiving space 535 jointly enclosed by the first extension wall 531, the second extension wall 532, the top wall 533 and the bottom wall 534. The receiving space 535 is used for at least partially accommodating the mating backplane connector (not shown). Specifically, in the illustrated embodiment of the present disclosure, both the first extension wall 531 and the second extension wall 532 include a plurality of positioning grooves 530 in order to improve the mating accuracy of the mating backplane connector and the backplane connector 200.

Referring to FIGS. 5 to 10, each terminal module 6 includes an insulating frame 61, a plurality of conductive terminals 62 insert-molded with the insulating frame 61, a first metal shield 63 fixed on one side of the insulating frame 61, and a second metal shield 64 fixed on the other side of the insulating frame 61.

Figure 5:
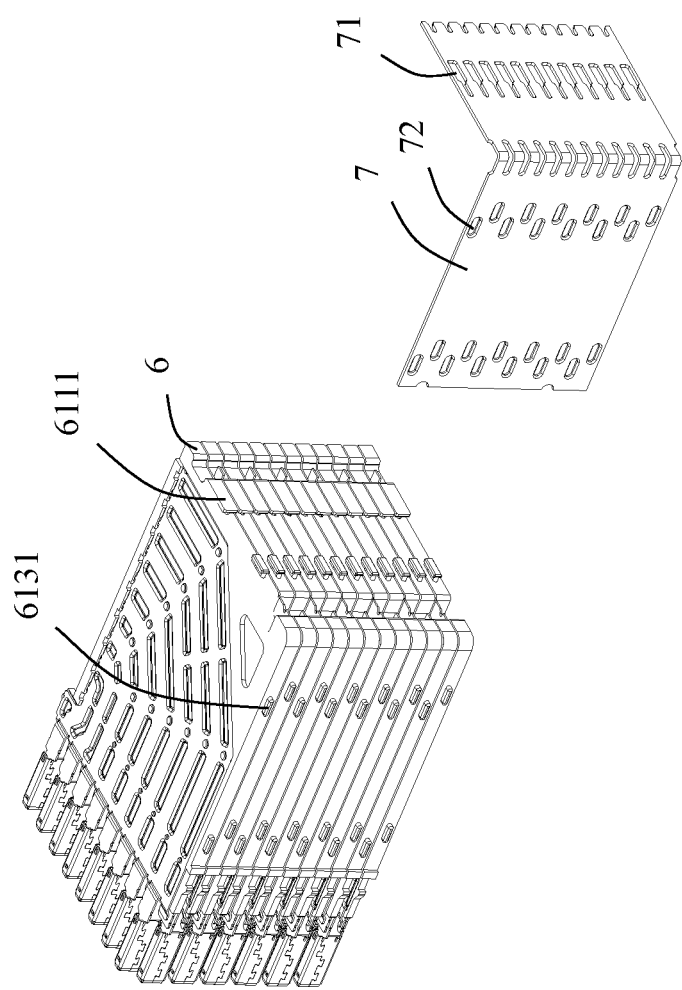
FIG. 5 is a partial exploded view of the backplane connector after removing a header in FIG. 3, in which a spacer is separated.
Figure 6:
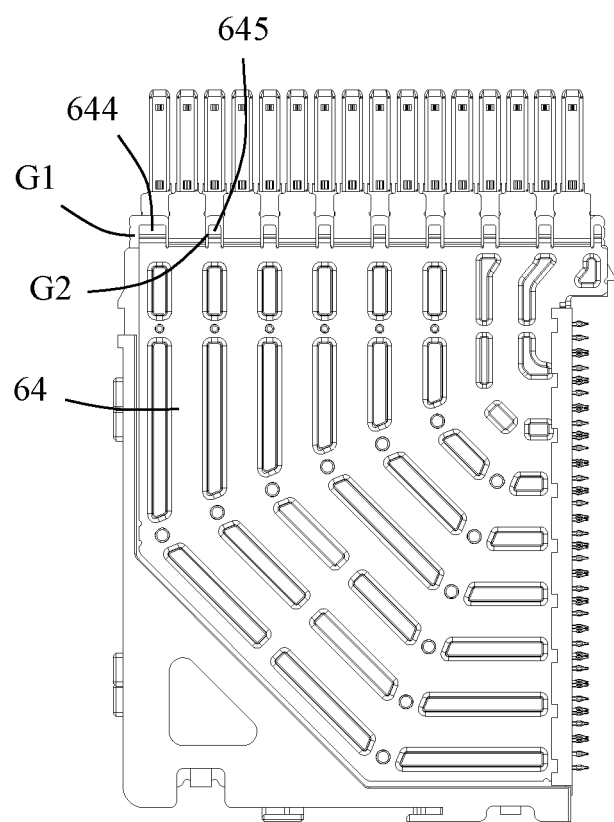
FIG. 6 is a side view of a terminal module of the backplane connector.
Figure 7:
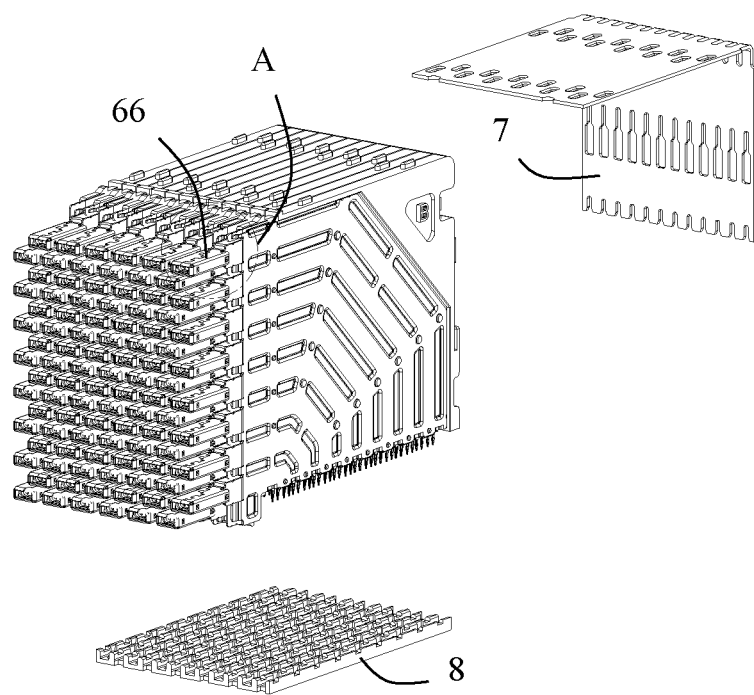
FIG. 7 is a partially exploded view of the backplane connector from another angle.
Figure 8:
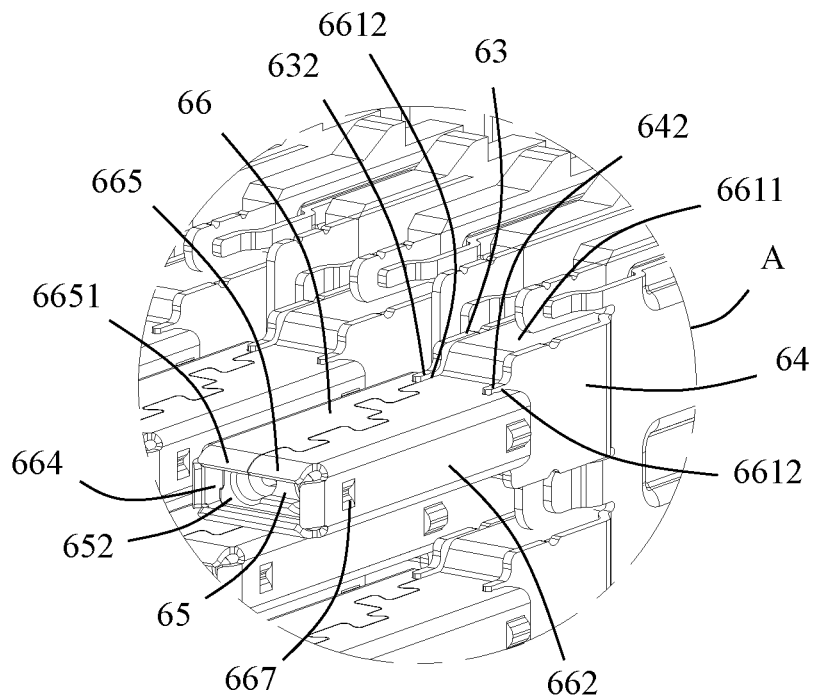
FIG. 8 is a partial enlarged view of a circled portion A in FIG. 7.
Figure 9:
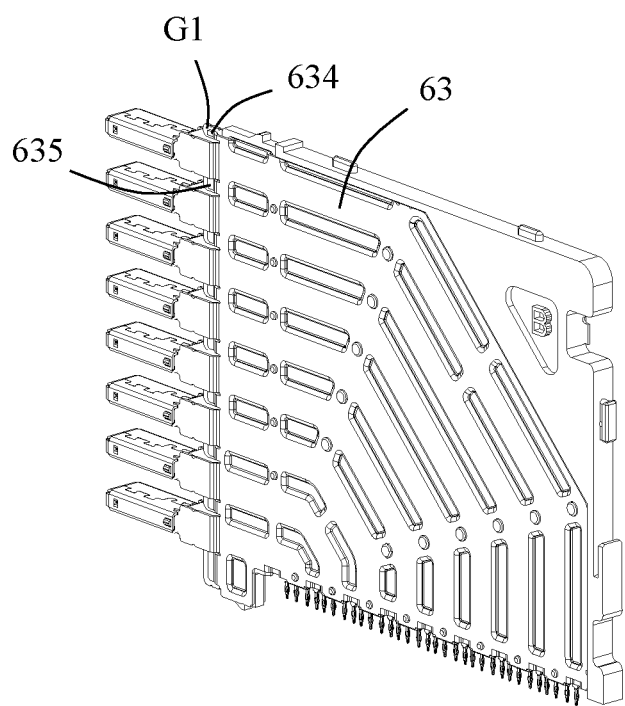
FIG. 9 is a perspective schematic view of the terminal module of the backplane connector.

Referring to FIGS. 10 to 13, the insulating frame 61 is roughly frame-shaped. Each insulating frame 61 includes a rear wall 611, a front wall 612 opposite to the rear wall 611, a top wall 613 connecting one end of the rear wall 611 and one end of the front wall 612, a bottom wall 614 connecting the other end of the rear wall 611 and the other end of the front wall 612, and a plurality of connecting walls 615. The connecting walls 615 can enhance the structural strength of the frame. The rear wall 611 includes a first protrusion 6111. The top wall 613 includes a second protrusion 6131. Referring to FIG. 5, the spacer 7 is roughly L-shaped and includes a plurality of first slots 71 and a plurality of second slots 72 for holding the first protrusions 6111 and the second protrusions 6131, respectively. With this arrangement, each terminal module 6 can be formed as a whole by providing the spacer 7. In the illustrated embodiment of the present disclosure, the insulating frame 61 includes a hollow portion 610. The connecting walls 615 include a first connecting wall 6151 connecting the top wall 613 and the bottom wall 614, and a second connecting wall 6152 connecting the rear wall 611 and the bottom wall 614. The first connecting wall 6151 and the second connecting wall 6152 are exposed in the hollow portion 610. The first connecting wall 6151 and the second connecting wall 6152 are disposed obliquely. One ends of the first connecting wall 6151 and the second connecting wall 6152 are adjacent to each other, and the other ends are spread out so as to form a radial shape. The connecting walls 615 also includes a reinforcing wall 6153 connecting the top wall 613 and the bottom wall 614 and parallel to the front wall 612.

Figure 10:
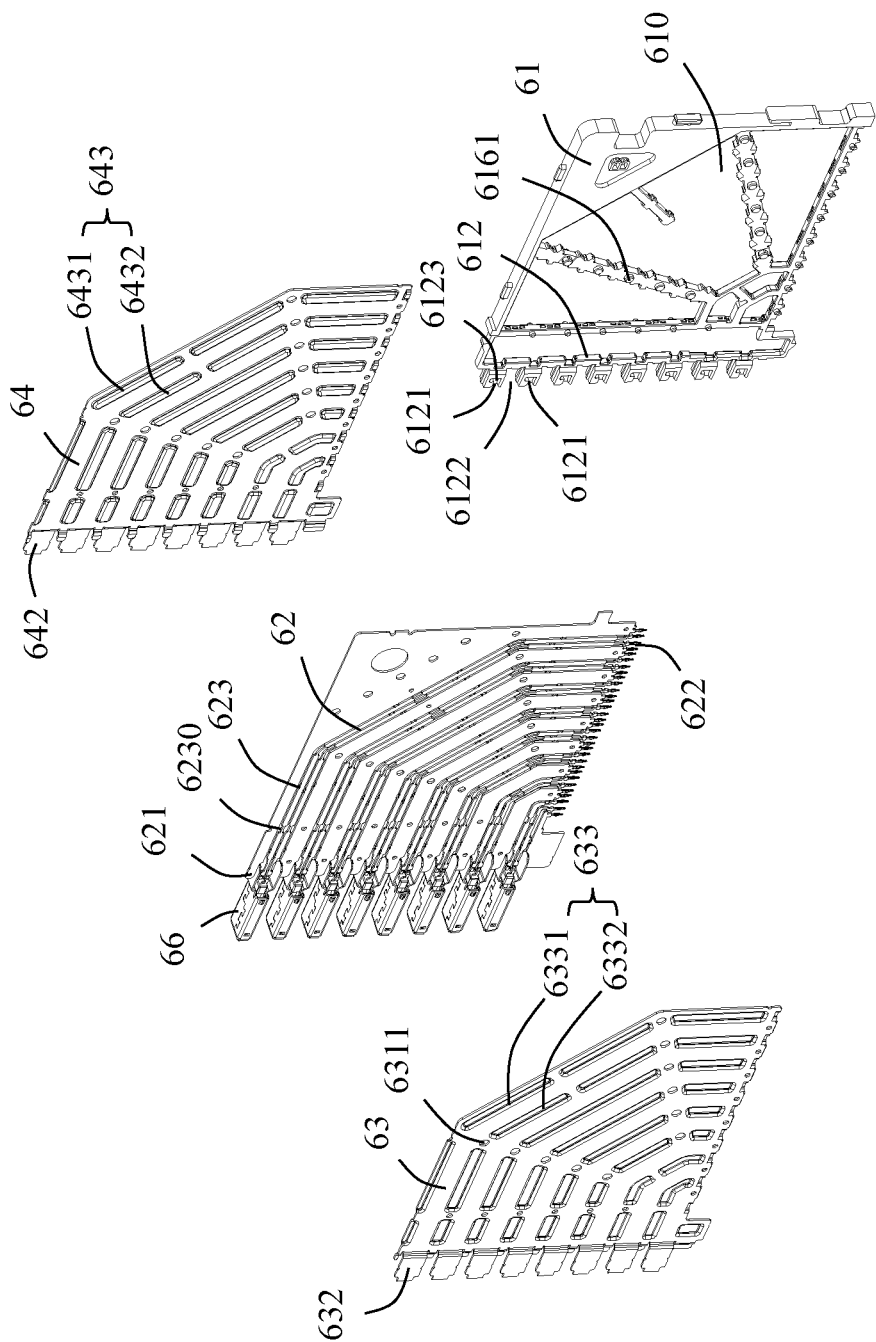
FIG. 10 is a partially exploded perspective view of FIG. 9.
Figure 13:
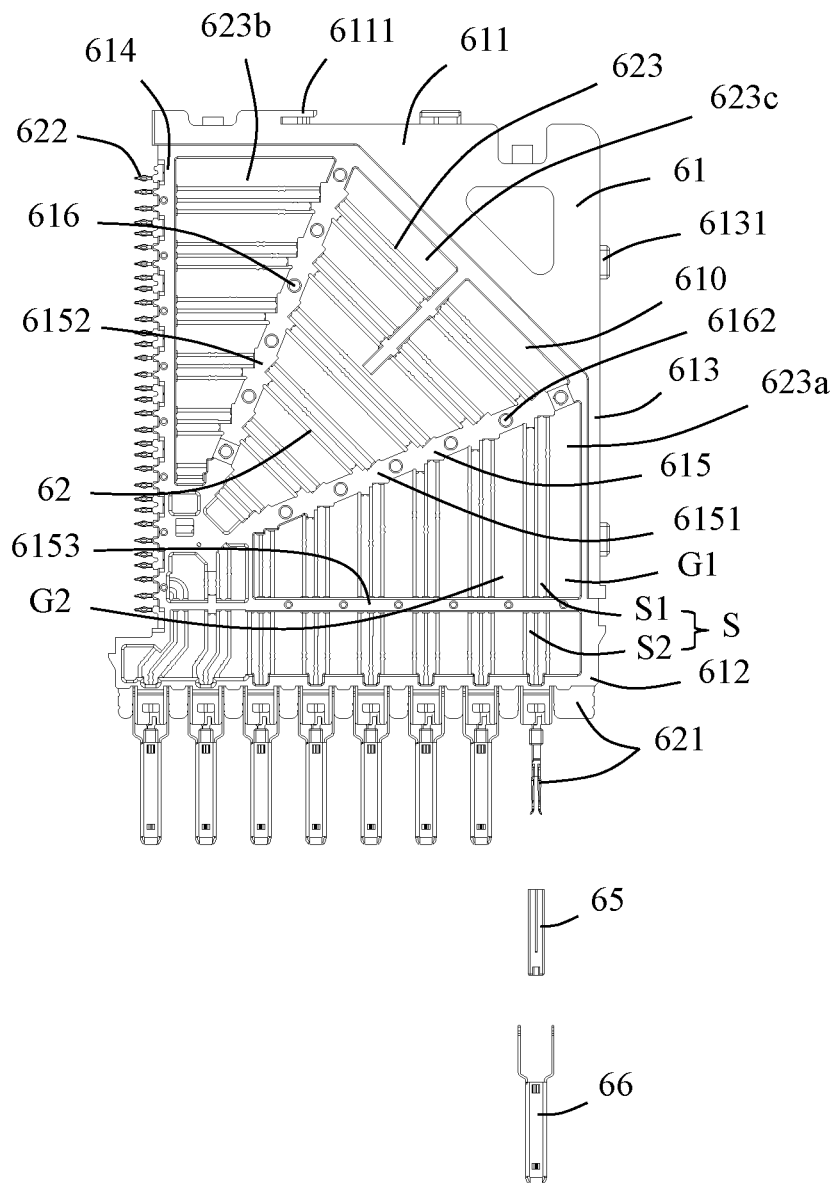
FIG. 13 is a side view of FIG. 9 after the first metal shield and the second metal shield are removed, in which a metal shield surrounding member and an insulating block are separated.

Referring to FIGS. 10 and 13, the front wall 612 includes a plurality of protruding blocks 6121 disposed at intervals and a groove 6122 located between two adjacent protruding blocks 6121. The protruding block 6121 includes an opening 6123 to partially expose corresponding conductive terminal 62 in order to adjust the impedance.

The insulating frame 61 further includes a plurality of posts 616 for fixing and positioning the first metal shield 63 and the second metal shield 64. In the illustrated embodiment of the present disclosure, the posts 616 are substantially cylindrical-shaped. In the illustrated embodiment of the present disclosure, the posts 616 are disposed on the bottom wall 614, the first connecting wall 6151 and the second connecting wall 6152. The first metal shield 63 and the second metal shield 64 are located on two sides of the insulating frame 61, respectively. The posts 616 include a plurality of first posts 6161 and a plurality of second posts 6162. The first posts 6161 and the second posts 6162 are located on opposite sides of the insulating frame 61 so to be fixed to the first metal shield 63 and the second metal shield 64, respectively.

Referring to FIGS. 16 to 21, in the illustrated embodiment of the present disclosure, each group of conductive terminals 62 are formed by splicing two parts. Each group of conductive terminals 62 include a contact portion 621, a connection portion 623, a transition portion 624 connected to the contact portion 621, and a tail portion 622 connected to the connection portion 623. The mounting block 8 includes a plurality of through holes for the tail portions 622 to pass through, so as to facilitate the positioning of each tail portion 622. This facilitates the mounting of the tail portions 622 to the circuit board 302. Some of the contact portions 621 are used to electrically connect with the mating backplane connector. In the illustrated embodiment of the present disclosure, the connection portion 623 is curved. Specifically, the connection portion 623 includes a first section 623a parallel to the contact portion 621, a second section 623b parallel to the tail portion 622, and a third section 623c connecting the first section 623a and the second section 623b. Referring to FIG. 13, the first section 623a extends vertically, the second section 623b extends horizontally, and the third section 623c extends obliquely.

Each group of conductive terminals 62 include a plurality of first ground terminals G1, a plurality of second ground terminals G2, and a plurality of signal terminals S. The plurality of signal terminals S include a plurality of first signal terminals S1 and a plurality of second signal terminals S2. In the illustrated embodiment of the present disclosure, the adjacent first signal terminal S1 and the second signal terminal S2 form a pair of differential signal terminals (Differential Pair). Each pair of differential signal terminals are located between one first ground terminal G1 and one second ground terminal G2. That is, each group of conductive terminals 62 are disposed in a manner of G1-S1-S2-G2, which is beneficial to improve the quality of signal transmission. The differential signal terminals are narrow-side coupling or wide-side coupling. A width of the first ground terminal G1 and a width of the second ground terminal G2 are greater than a width of each first signal terminal S1 and a width of each second signal terminal S2 therebetween, which is beneficial to increase the shielding area and improve the shielding effect.

Figure 19:
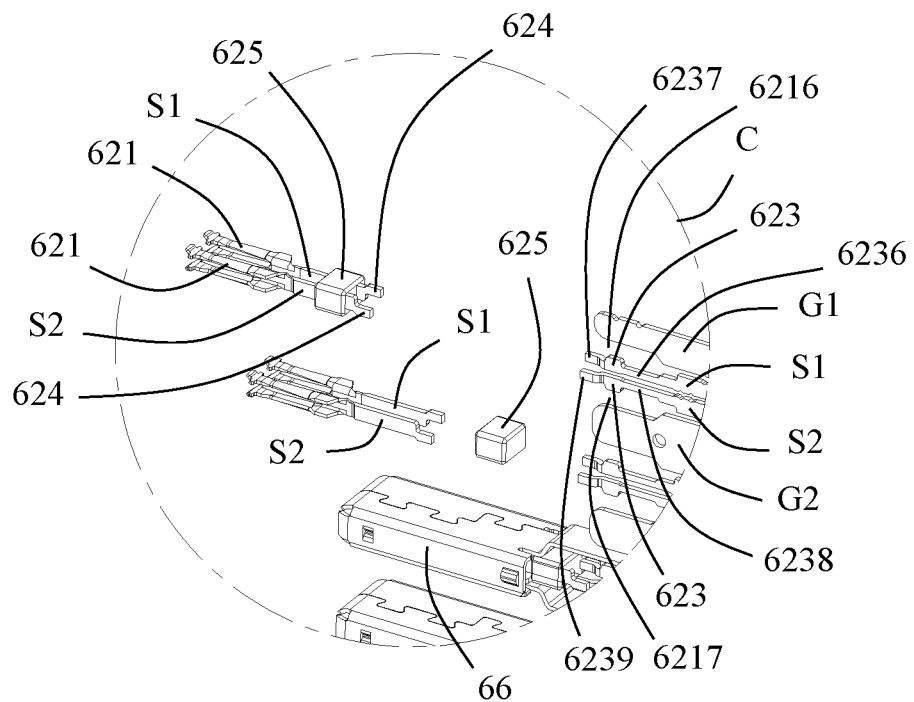
FIG. 19 is a partial enlarged view of a circled portion C in FIG. 16.
Figure 20:
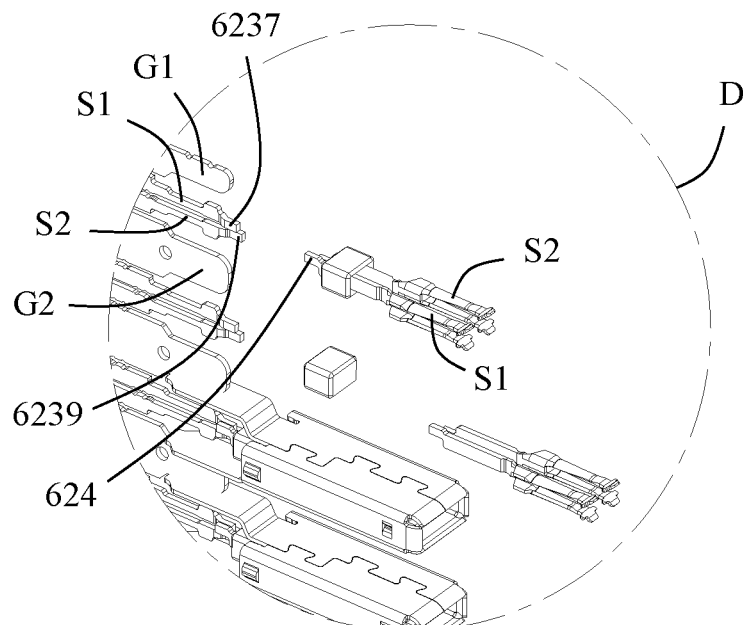
FIG. 20 is a partial enlarged view of a circled portion D in FIG. 17.
Figure 21:
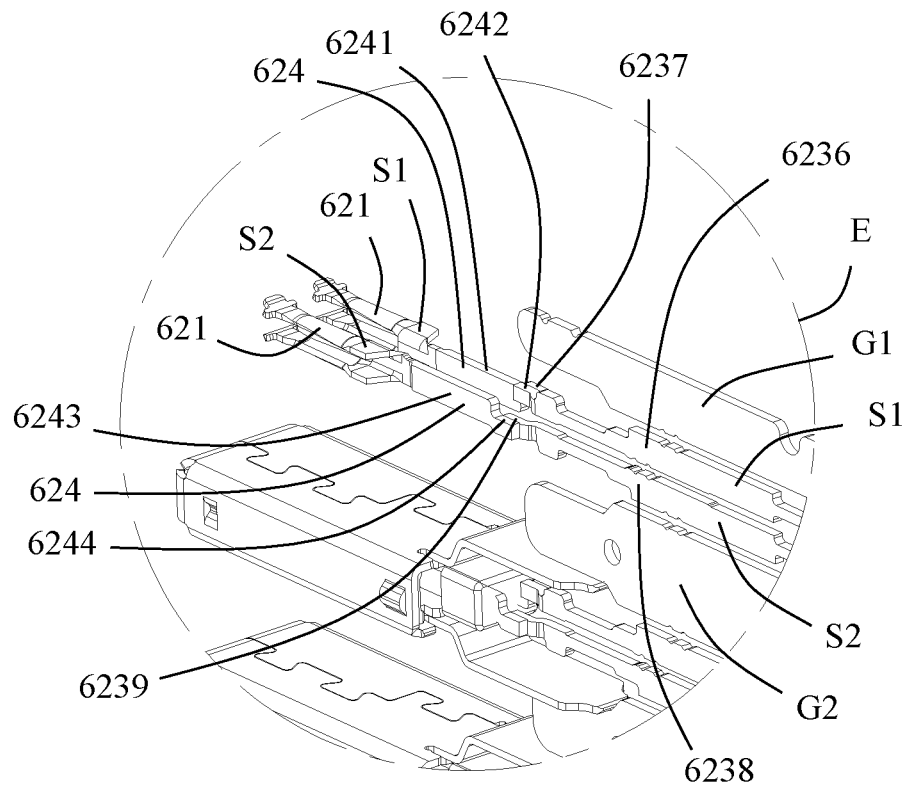
FIG. 21 is a partial enlarged view of a circled portion E in FIG. 18.
Figure 21:
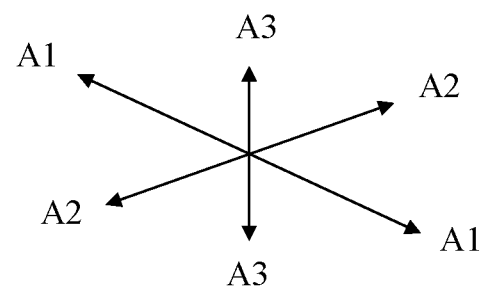

In the illustrated embodiment of the present disclosure, the connection portions 623 of the conductive terminals 62 are insert-molded with the insulating frame 61. The connection portions 623 of the differential signal terminals, the connection portion 623 of the first ground terminal G1 and the connection portion 623 of the second ground terminal G2 are all exposed in the same hollow portion 610. The connection portion 623 of the signal terminal S includes a narrowed portion 6230 (referring to FIG. 10) embedded in the insulating frame 61 to adjust the impedance of the signal terminal S in order to achieve impedance matching. Referring to FIGS. 19 to 21, in the illustrated embodiment of the present disclosure, the contact portions 621 of the differential signal terminals and the connection portions 623 of the differential signal terminals are provided separately. The transition portions 624 of the differential signal terminals are electrically connected to the connection portions 623 of the differential signal terminals. In an embodiment of the present disclosure, the transition portions 624 of the differential signal terminals and the connection portions 623 of the differential signal terminals are fixed by soldering. Of course, in other embodiments, the transition portions 624 of the differential signal terminals and the connection portions 623 of the differential signal terminals may also be in direct contact or fixed by conductive glue, so as to achieve electrical connection.

Specifically, referring to FIGS. 21 to 26, the transition portion 624 of the first signal terminal S1 abuts against the connection portion 623 of the first signal terminals S1. The transition portion 624 of the second signal terminal S2 abuts against the connection portion 623 of the second signal terminal S2. The transition portion 624 of the first signal terminal S1 and the connection portion 623 of the first signal terminal S1 are both plate-shaped, and are respectively located in two planes parallel to each other. The transition portion 624 of the second signal terminal S2 and the connection portion 623 of the second signal terminal S2 are both plate-shaped and located in two planes parallel to each other. The transition portion 624 of the first signal terminal S1 includes a first transition body portion 6241 connected to the contact portion 621 of the first signal terminal S1, and a first transition end 6242 connected to the first transition body portion 6241. The transition portion 624 of the second signal terminal S2 includes a second transition body portion 6243 connected to the contact portion 621 of the second signal terminal S2, and a second transition end 6244 connected to the second transition body portion 6243. The connection portion 623 of the first signal terminal S1 includes a first connection body portion 6236 and a first connection end 6237 connected to the first connection body portion 6236. The connection portion 623 of the second signal terminal S2 includes a second connection body portion 6238 and a second connecting end 6239 connected to the second connection body portion 6238. In the illustrated embodiment of the present disclosure, the first transition body portion 6241 of the first signal terminal S1 and the first transition end 6242 of the first signal terminal S1 are located in the same plane. This facilitates the manufacturing of the transition portion 624 of the first signal terminal S1 by stamping, avoids the use of complicated processes such as twisting, and reduces the cost. Similarly, in the illustrated embodiment of the present disclosure, the second transition body portion 6243 of the second signal terminal S2 and the second transition end 6244 of the second signal terminal S2 are located in the same plane. This facilitates the manufacture of the transition portion 624 of the second signal terminal S2 by stamping, avoids the use of complicated processes such as twisting, and reduces the cost.

Figure 26:
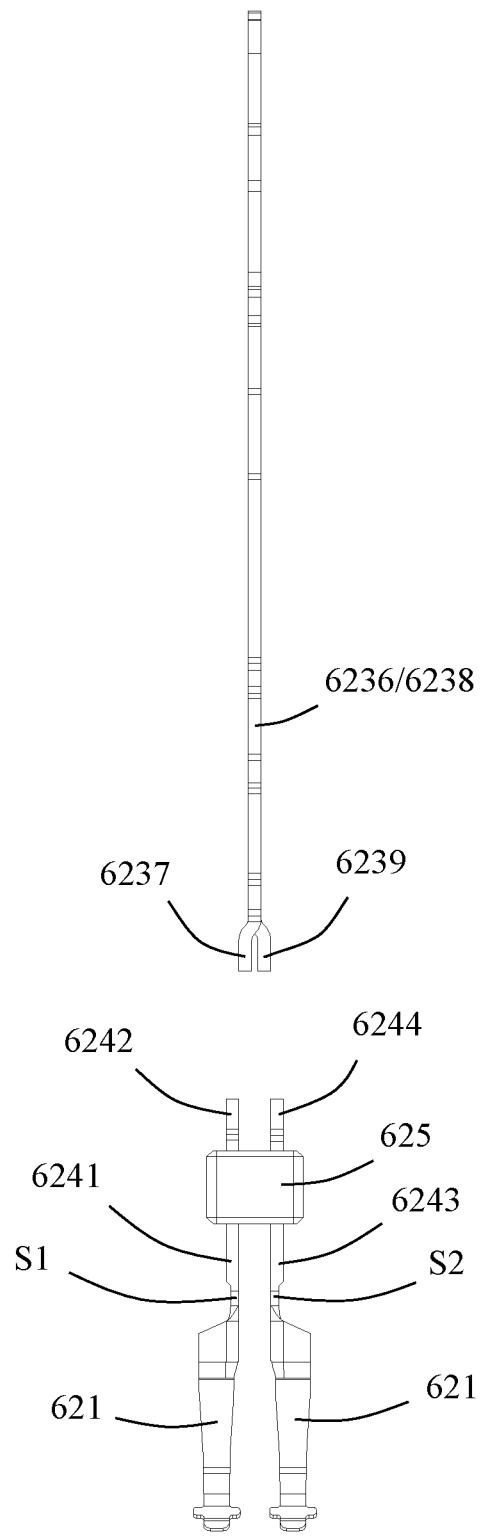
FIG. 26 is a partial exploded view of FIG. 25.

Referring to FIG. 21, in the same pair of differential signal terminals, the first transfer body portion 6241 of the first signal terminal S1 and the second transfer body portion 6243 of the second signal terminal S2 are spaced apart from each other along the second direction A2-A2. The first transition end 6242 of the first signal terminal S1 and the second transition end 6244 of the second signal terminal S2 are spaced up and down along the third direction A3-A3. Referring to FIG. 26, the first connection end 6237 of the first signal terminal S1 is offset outwardly from the first connection body portion 6236 of the first signal terminal S1. The second connection end 6239 of the second signal terminal S2 is offset outwardly from the second connection body portion 6238 of the second signal terminal S2. Deviation directions of the first connection end 6237 of the first signal terminal S1 and the second connection end 6239 of the second signal terminal S2 are opposite to each other. With this arrangement, a distance between the first connection end 6237 of the first signal terminal S1 and the second connection end 6239 of the second signal terminal S2 in the second direction A2-A2 can be optimized, so as to facilitate contact with the first transition end 6242 of the first signal terminal S1 and the second transition end 6244 of the second signal terminal S2, respectively. The first transition end 6242 of the first signal terminal S1 is located outside the first connection end 6237 of the first signal terminal S1. The second transition end 6244 of the second signal terminal S2 is located outside the second connection end 6239 of the second signal terminal S2. This arrangement can better prevent the first transition end 6242 of the first signal terminal S1 from contacting the second transition end 6244 of the second signal terminal S2, thereby avoiding data transmission disorder.

Figure 22:
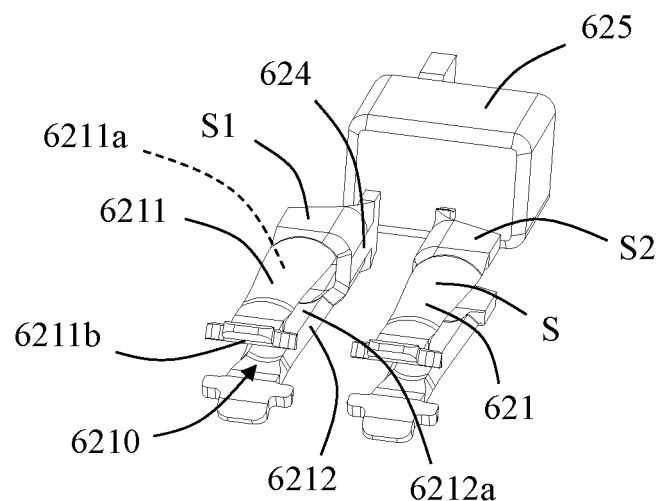
FIG. 22 is a perspective schematic view of a module with a fixing block, a part of the first signal terminal and a part of the second signal terminal fixed together.
Figure 23:
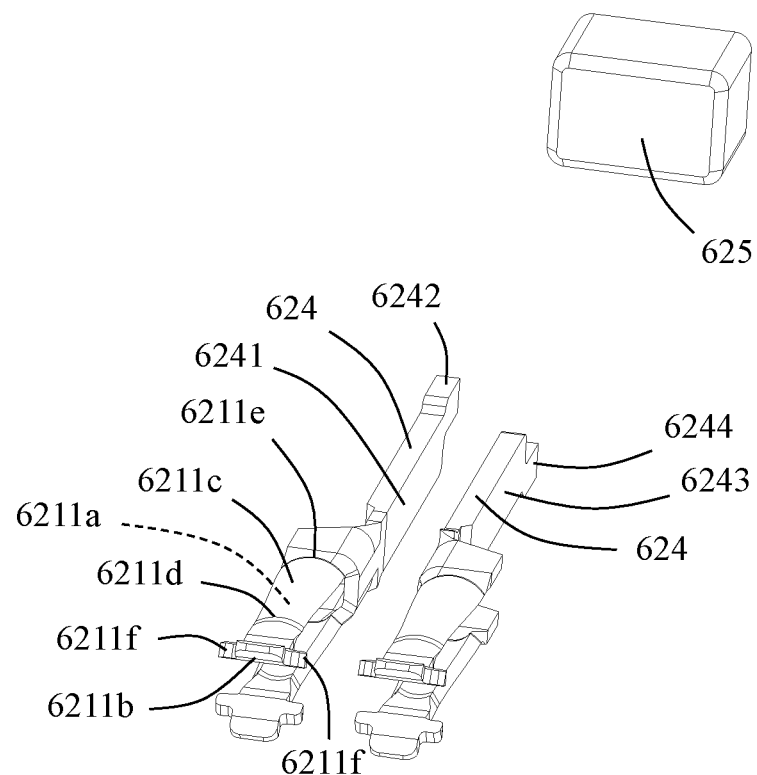
FIG. 23 is a perspective exploded view of FIG. 22.
Figure 24:
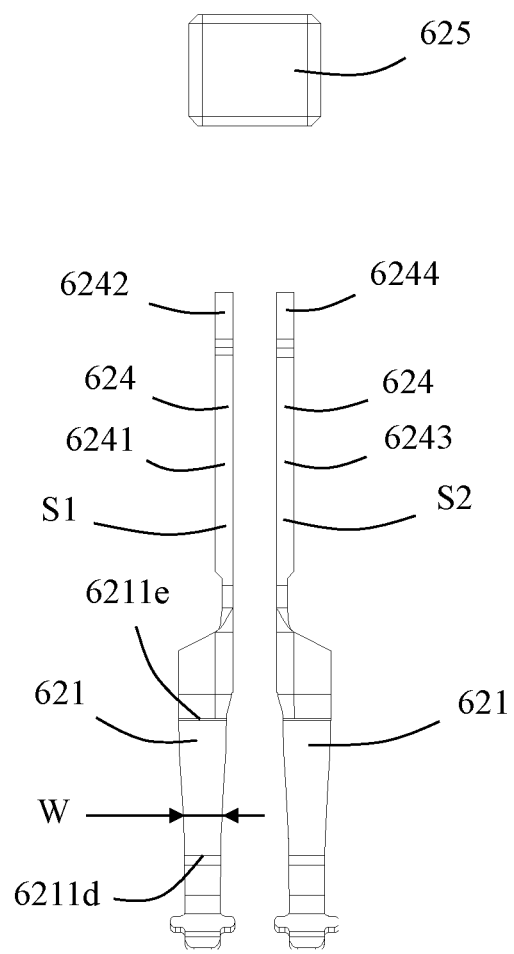
FIG. 24 is a top view of FIG. 23.
Figure 25:
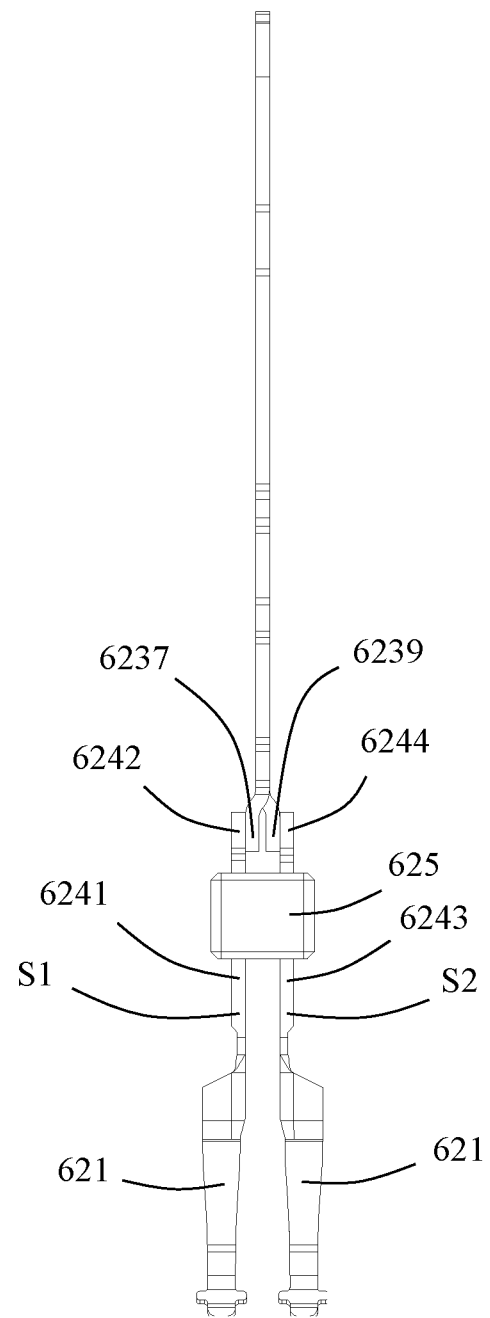
FIG. 25 is a top view of the first signal terminal, the second signal terminal and the fixing block when they are mated together.

Referring to FIGS. 22 and 23, in the illustrated embodiment of the present disclosure, each contact portion 621 of the signal terminal S has a two-half configuration. In the same pair of differential signal terminals, the contact portion 621 of the first signal terminal S1 and the contact portion 621 of the second signal terminal S2 are disposed symmetrically. Hereinafter, only the contact portion 621 of the first signal terminal S1 is taken as an example for description.

The contact portion 621 of the first signal terminal S1 includes a first contact arm 6211, a second contact arm 6212 opposite to the first contact arm 6211, and a first clamping space 6210 located between the first contact arm 6211 and the second contact arm 6212. The first contact arm 6211 and the second contact arm 6212 are formed by bending two opposite edges of the transition portion 624 of the first signal terminal S1 to the same side. The first contact arm 6211 and the second contact arm 6212 are disposed symmetrically. The first contact arm 6211 includes a first arc-shaped surface 6211a located inside. The second contact arm 6212 includes a second arcuate surface 6212a located inside. The first clamping space 6210 is located between the first arc-shaped surface 6211a and the second arc-shaped surface 6212a. The first contact arm 6211 includes a first contact end portion 6211b and a first contact arm body portion 6211c connected to the first contact end portion 6211b. The first contact arm body portion 6211c includes a first end 6211d connected to the first contact end portion 6211b and a second end 6211e disposed opposite to the first end 6211d. From the first end 6211d to the second end 6211e, a width W of the first contact arm body portion 6211c gradually increases (referring to FIG. 24). The first contact arm 6211 further includes limiting blocks 6211f extending from the first contact end portion 6211b to both sides.

When a needle-shaped signal terminal of the mating backplane connector is inserted into the first clamping space 6210, the first contact arm 6211 and the second contact arm 6212 can be elastically deformed so as to improve contact reliability. The limiting blocks 6211f can prevent the first contact arm 6211 from being over-deformed. The first arc-shaped surface 6211a and the second arc-shaped surface 6212a can increase the contact area when mated with the signal terminal of the mating backplane connector, and further improve the contact reliability.

In addition, in order to improve assembly efficiency, the terminal module 6 further includes a fixing block 625 fixed on the first transition body portion 6241 of the first signal terminal S1 and the second transition body portion 6243 of the second signal terminal S2. The fixing block 625 is made of insulating material. In an embodiment of the present disclosure, the fixing block 625 is over-molded on the first transition body portion 6241 of the first signal terminal S1 and the second transition body portion 6243 of the second signal terminal S2. Of course, in other embodiments, the fixing block 625 can also be fixed on the first transition body portion 6241 of the first signal terminal S1 and the second transition body portion 6243 of the second signal terminal S2 by assembling. This can also realize the combination of the first transition body portion 6241 of the first signal terminal S1 and the second transition body portion 6243 of the second signal terminal S2 into an integral part. With this arrangement, on the one hand, the distance between the first transition body portion 6241 of the first signal terminal S1 and the second transition body portion 6243 of the second signal terminal S2 can be ensured, thereby improving the accuracy of matching with the first connection end 6237 of the first signal terminal S1 and the second connection end 6239 of the second signal terminal S2; on the other hand, the integral part can improve the assembly efficiency compared with single parts.

Each contact portion 621 of the first ground terminal G1 and the second ground terminal G2 is substantially flat. The contact portion 621 of the first ground terminal G1, the contact portion 621 of the second ground terminal G2, and the connection portions 623 of the conductive terminals 62 are all coplanar. The contact portion 621 of the first ground terminal G1 and the contact portion 621 of the second ground terminal G2 both extend into the corresponding grooves 6122 to facilitate contact with the first metal shield 63 and the second metal shield 64. The contact portions 621 of the signal terminals S extend beyond the protruding block 6121.

Figure 14:
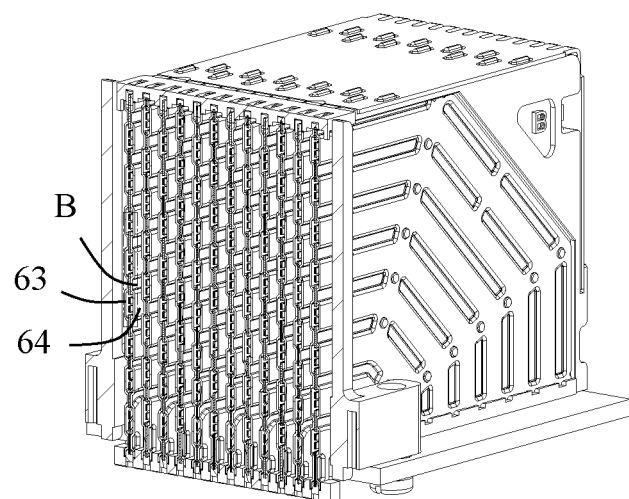
FIG. 14 is a partial cross-sectional view of the backplane connector when mounted on the circuit board.
Figure 15:
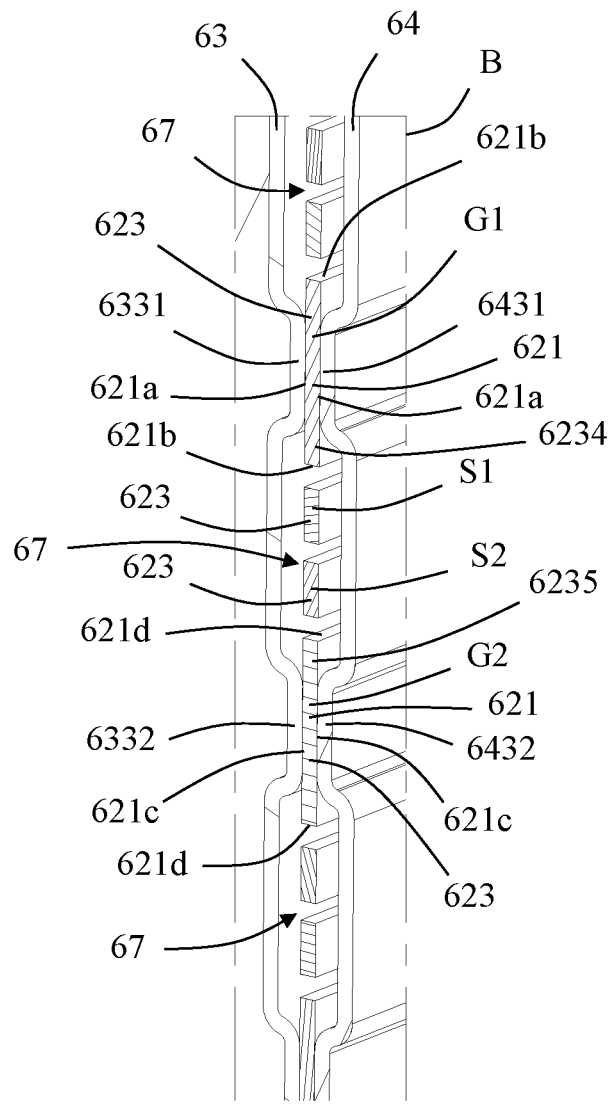
FIG. 15 is a partial enlarged view of a frame portion B in FIG. 14.
Figure 16:
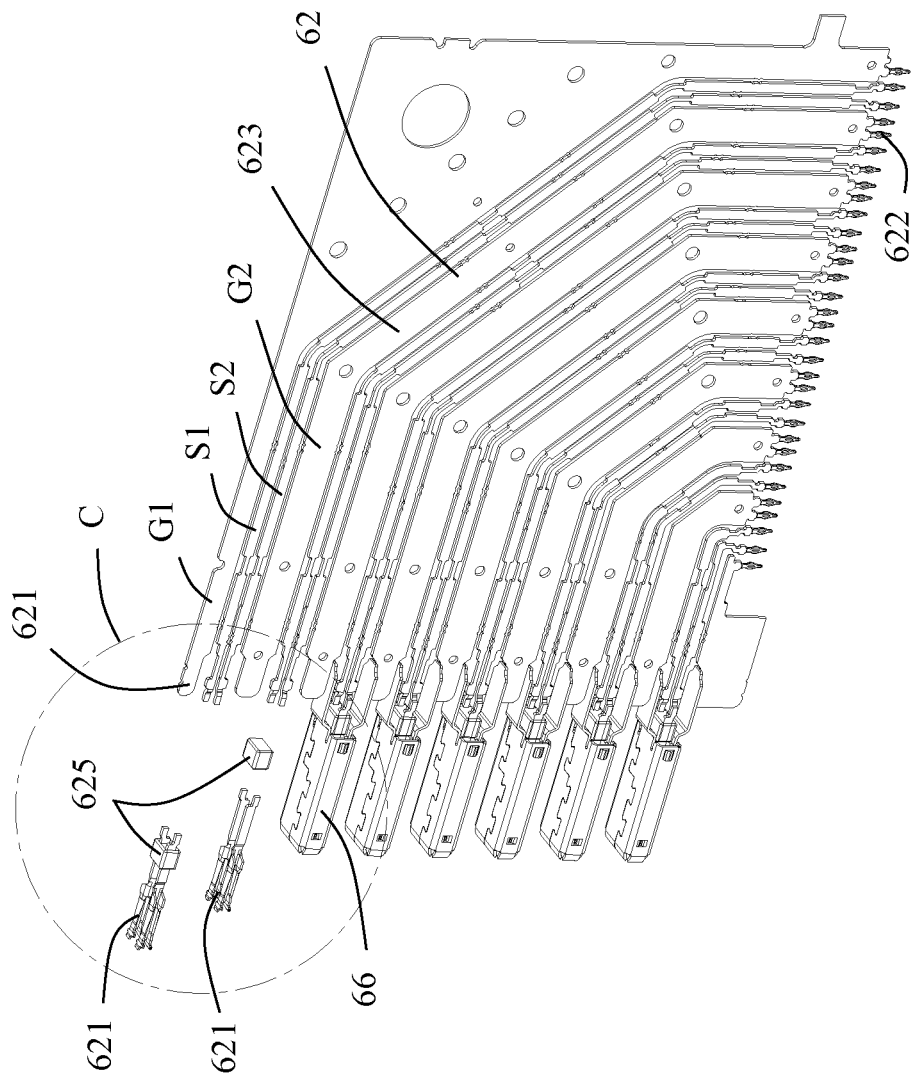
FIG. 16 is a partial perspective exploded view of conductive terminals of a terminal module.
Figure 17:
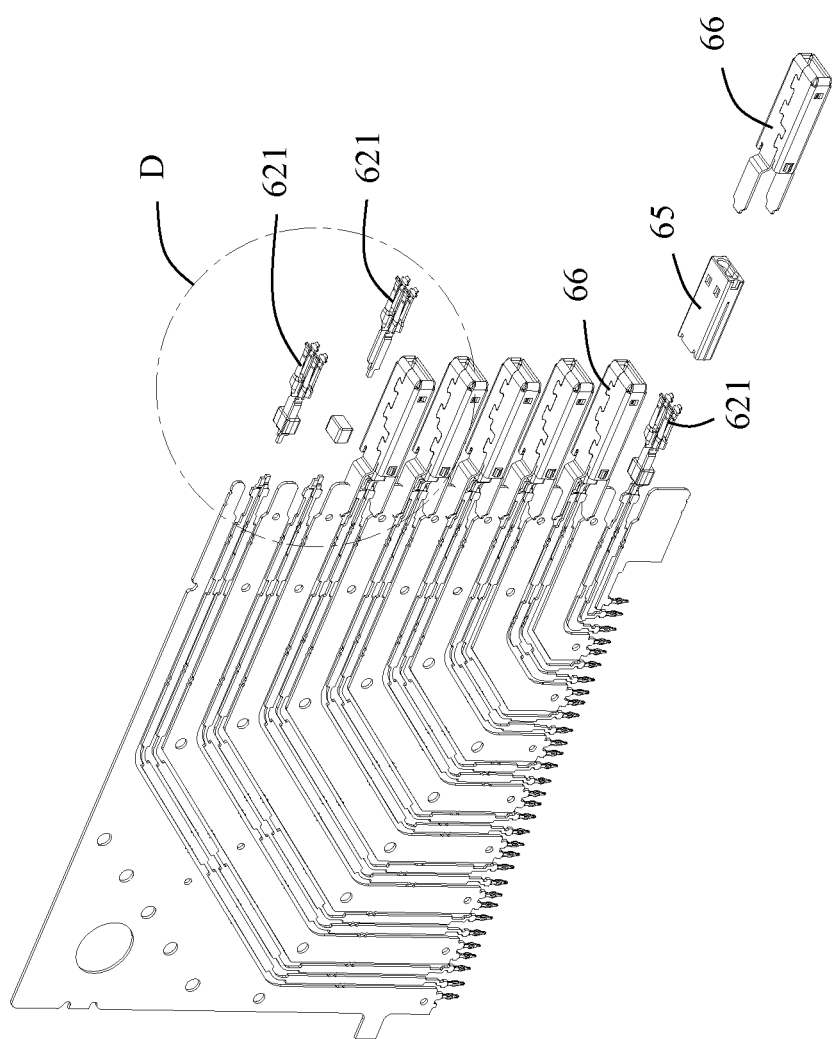
FIG. 17 is a partial perspective exploded view of the conductive terminals of the terminal module from another angle.
Figure 18:
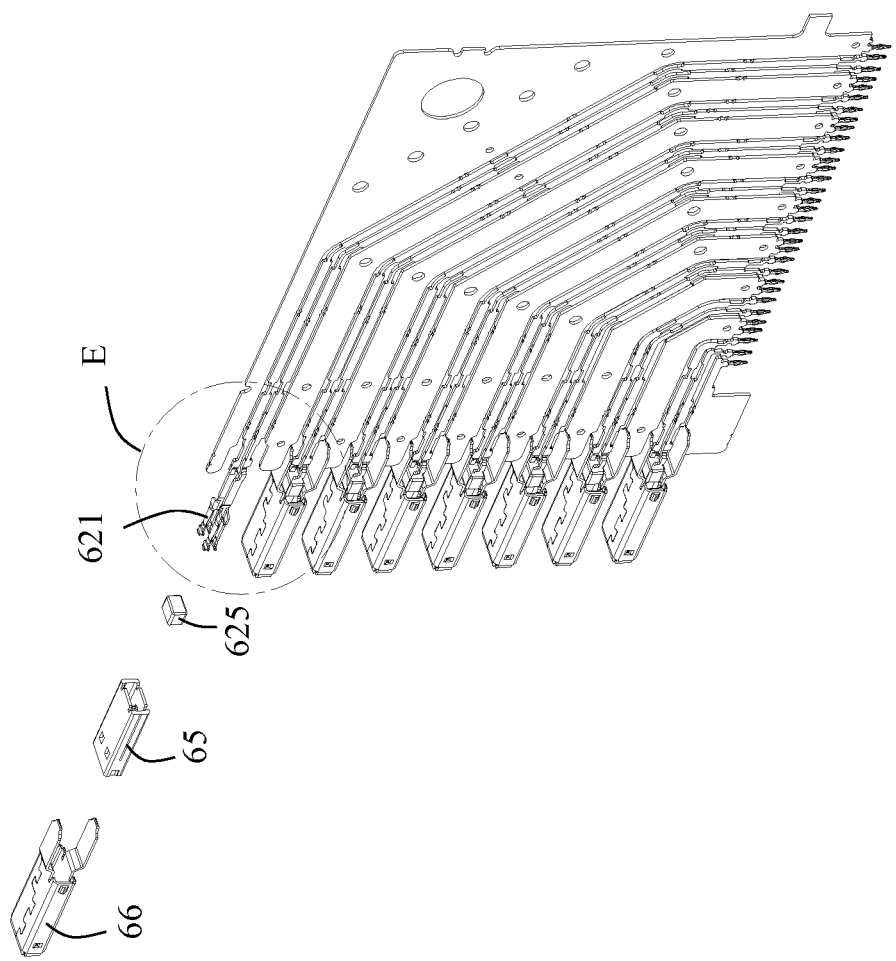
FIG. 18 is a partial perspective exploded view of the conductive terminals of the terminal module from a different angle.

Referring to FIGS. 14 and 15, in the illustrated embodiment of the present disclosure, the contact portion 621 and the connection portion 623 of the first ground terminal G1 both include a first wide surface 621a and a first narrow surface 621b perpendicular to the first wide surface 621a. The contact portion 621 and the connection portion 623 of the second ground terminal G2 both include a second wide surface 621c and a second narrow surface 621d perpendicular to the second wide surface 621c. The connection portions 623 of each pair of differential signal terminals are located between the first narrow surface 621b of the first ground terminal G1 and the second narrow surface 621d of the second ground terminal G2 which are located on opposite sides of the connection portions 623 of each pair of differential signal terminals.

Figure 27:
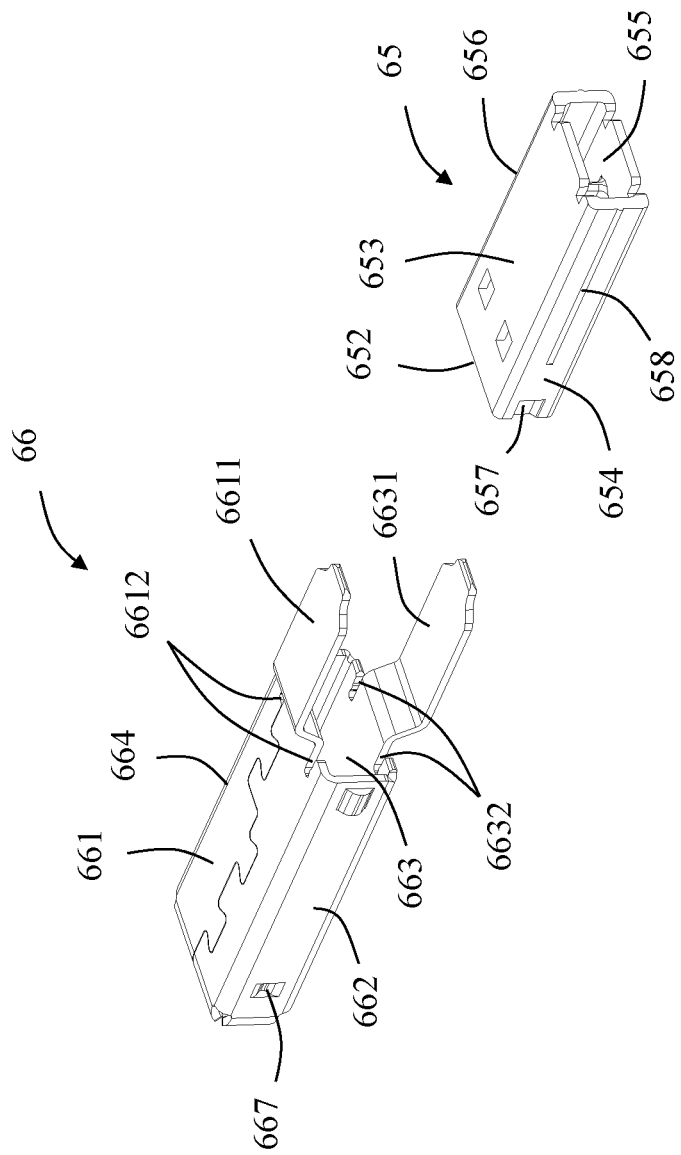
FIG. 27 is a perspective exploded view of the metal shield surrounding member and the insulating block.
Figure 28:
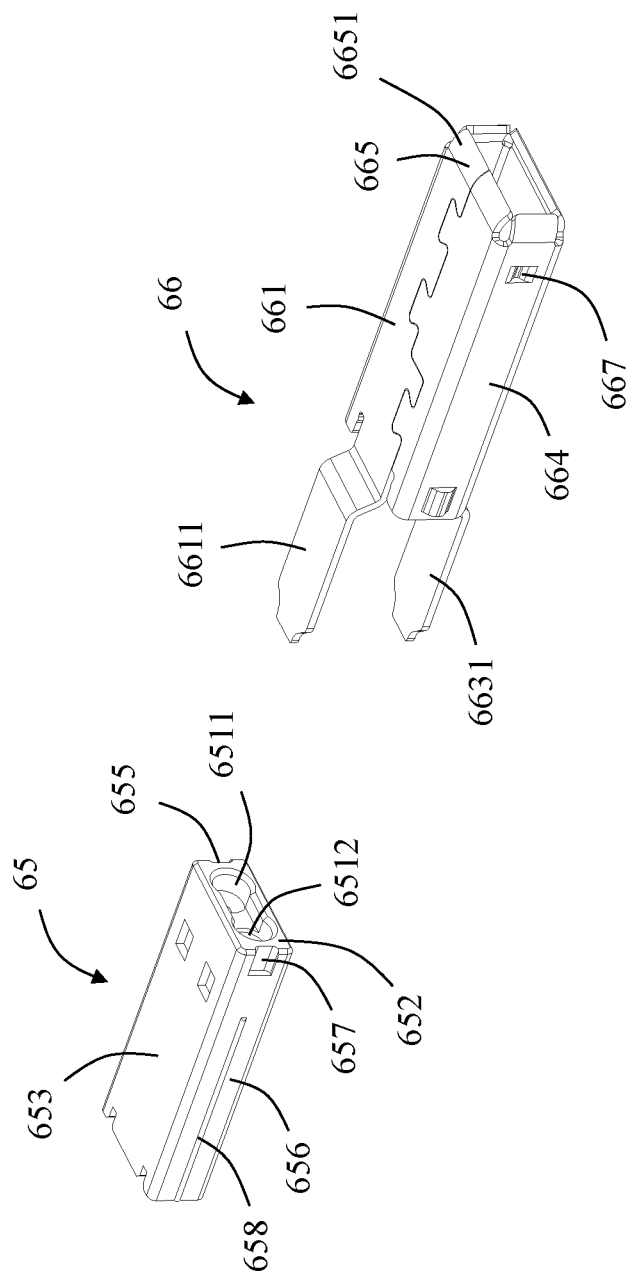
FIG. 28 is an exploded perspective view of FIG. 27 from another angle.

Referring to FIGS. 16 to 21, 27 and 28, each group of terminal modules 6 further includes an insulating block 65 sleeved on the contact portions 621 of the signal terminals S, and a metal shield surrounding member 66 sleeved on the insulating block 65. Referring to FIG. 28, each of the insulating blocks 65 includes a mating surface 652 at an end, a first terminal receiving hole 6511 extending through the mating surface 652, and a second terminal receiving hole 6512 extending through the mating surface 652. Referring to FIGS. 27 and 28, in the illustrated embodiment of the present disclosure, the insulating block 65 is substantially cuboid shaped. The insulating block 65 includes a first side surface 653, a second side surface 654, a third side surface 655, and a fourth side surface 656 which are connected in sequence. Each of second side surface 654 and the fourth side surface 656 includes a limiting groove 657 extending through the mating surface 652 and a protruding rib 658 located behind the limiting groove 657.

The metal shield surrounding member 66 is substantially cuboid shaped. In an embodiment of the present disclosure, the insulating block 65 is fixed in the metal shield surrounding member 66 by soldering. Of course, in other embodiments, the insulating block 65 may also be fixed in the metal shield surrounding member 66 in other ways.

Referring to FIGS. 27 and 28, the metal shield surrounding member 66 includes a first side wall 661, a second side wall 662, a third side wall 663 and a fourth side wall 664. The first side wall 661 is opposite to the third side wall 663. The second side wall 662 is opposite to the fourth side wall 664. The first side wall 661, the second side wall 662, the third side wall 663 and the fourth side wall 664 respectively correspond to the first side surface 653, the second side surface 654, the third side surface 655 and the fourth side surface 656 of the insulating block 65. An area of either of the first side wall 661 and the third side wall 663 is larger than an area of either of the second side wall 662 and the fourth side wall 664. The ends of the first side wall 661, the second side wall 662, the third side wall 663 and the fourth side wall 664 all include a deflection portion 665 which is bent inwardly. By providing the deflection portions 665, a constricted portion can be formed at an end of the metal shield surrounding member 66, so that outer surfaces 6651 of the deflection portions 665 can guide the terminal module 6 to be assembled to the header 5, and even guide the metal shield surrounding member 66 to be inserted into the mating backplane connector. In addition, in order to better restrict the insulating block 65, the second side wall 662 and the fourth side wall 664 further include limiting protrusions 667 formed by stamping the second side wall 662 and the fourth side wall 664 inwardly. When the metal shield surrounding member 66 and the insulating block 65 are assembled, the limiting protrusions 667 extend into the limiting grooves 657. When the metal shield surrounding member 66 and the insulating block 65 are assembled in place, the protruding ribs 658 of the second side surface 654 and the fourth side surface 656 abut against the second side wall 662 and the fourth side wall 664, respectively, so as to improve fixing force. In addition, the limiting protrusions 667 abut against the rear ends of the limiting grooves 657 so as to limit the relative position between the metal shield surrounding member 66 and the insulating block 65.

In the illustrated embodiment of the present disclosure, the metal shield surrounding member 66 further includes a first extension piece 6611 extending from the first side wall 661 and a pair of first slots 6612 located on opposite sides of the first extension piece 6611. The metal shield surrounding member 66 further includes a second extension piece 6631 extending from the third side wall 663 and a pair of second slots 6632 located on opposite sides of the second extension piece 6631. The first extension piece 6611 is in vertical contact with the contact portion 621 of the first ground terminal G1 so as to improve the shielding effect. The second extension piece 6631 is in vertical contact with the contact portion 621 of the second ground terminal G2 so as to improve the shielding effect. In the illustrated embodiment of the present disclosure, the first extension piece 6611 and the second extension piece 6631 are deflected outwardly and then extend, so that a distance between the first extension piece 6611 and the second extension piece 6631 on the same metal shield surrounding member 66 is greater than a distance between the first side wall 661 and the third side wall 663. Referring to FIG. 19, for a group of conductive terminals 62 disposed in the manner of G1-S1-S2-G2, the contact portion 621 of the first ground terminal G1 includes a first notch 6216 adjacent to the differential signal terminals. The first notch 6216 is used for receiving the first extension piece 6611. The contact portion 621 of the second ground terminal G2 includes a second notch 6217 adjacent to the differential signal terminals. The second notch 6217 is used for receiving the second extension piece 6631. In the illustrated embodiment of the present disclosure, taking two adjacent pairs of differential signal terminals sharing one second ground terminal G2 as an example, two sides of the second ground terminal G2 respectively include second notches 6217 facing different differential signal terminals, and the second notches 6217 are used for mating with two adjacent metal shield surrounding members 66.

Figure 11:
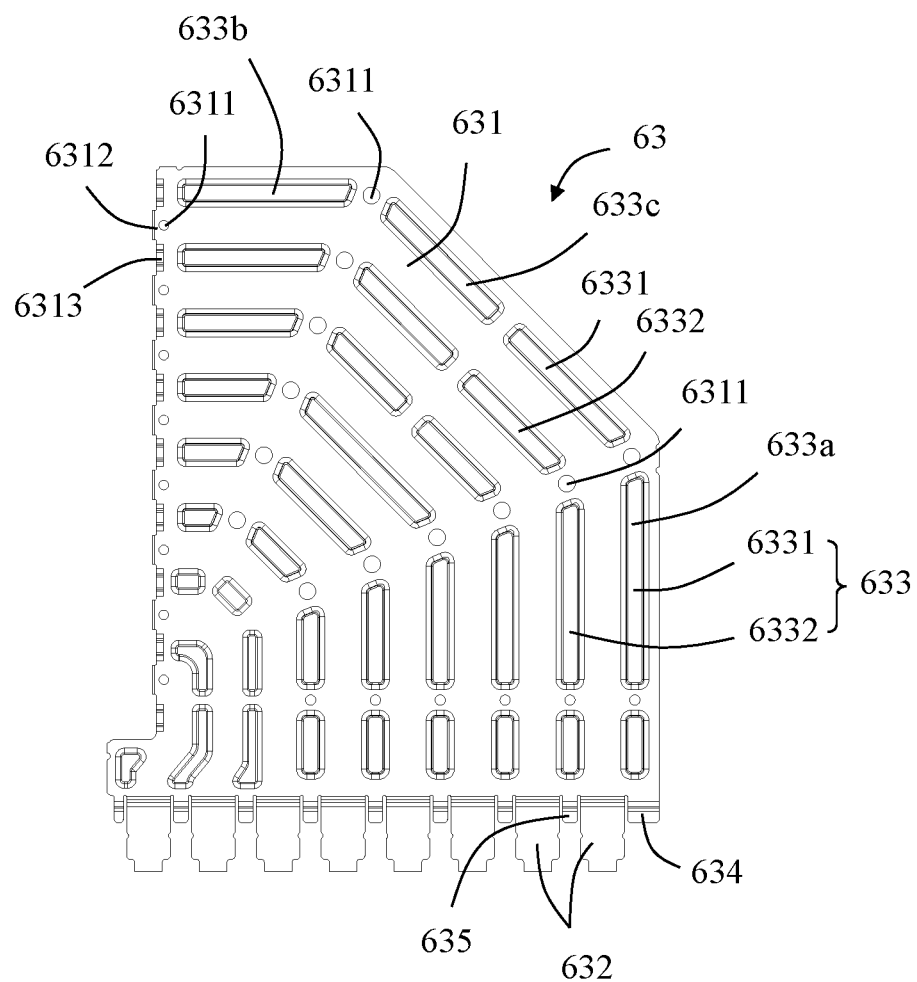
FIG. 11 is a side view of the first metal shield of the backplane connector.

In the illustrated embodiment of the present disclosure, the first metal shield 63 and the second metal shield 64 are symmetrically disposed on both sides of the insulating frame 61. Referring to FIGS. 10 and 11, the first metal shield 63 includes a first main body portion 631, a first extension portion 632 extending from the first main body portion 631, and a first elastic arm 634 and a second elastic arm 635 which are respectively located on two sides of the first extension portion 632. The first elastic arm 634 and the second elastic arm 635 extend beyond the first main body portion 631 to contact the first ground terminal G1 and the second ground terminal G2, respectively. The first main body portion 631 is located on one side of the connection portion 623 of the conductive terminal 62. In the illustrated embodiment of the present disclosure, the first extension portion 632 and the first main body portion 631 are located in different planes, in which the first extension portion 632 is farther away from the second metal shield 64 than the first main body portion 631. The first main body portion 631 includes a plurality of first mounting holes 6311 for mating with the plurality of first posts 6161. The first posts 6161 are fixed to the first mounting holes 6311 by soldering. The first main body portion 631 includes a plurality of ribs 633. The ribs 633 include a plurality of first ribs 6331 protruding toward the first ground terminal G1 and a plurality of second ribs 6332 protruding toward the second ground terminal G2. The first ribs 6331 are disposed along an extending direction of the connection portion 623 of the first ground terminal G1. The second ribs 6332 are disposed along an extending direction of the connection portion 623 of the second ground terminal G2. In the illustrated embodiment of the present disclosure, the first ribs 6331 and the second ribs 6332 are formed by stamping the first main body portion 631. The first ribs 6331 and the second ribs 6332 protrude toward the second metal shield 64. The first ribs 6331 and the second ribs 6332 are disposed discontinuously along the extending direction of the connection portion 623 of the first ground terminal G1 and the extending direction of the connection portion 623 of the second ground terminal G2, respectively, so as to achieve multi-position contact. Therefore, the reliability of the contact between the first metal shield 63 and the first ground terminals G1 and the second ground terminals G2 is improved. In the illustrated embodiment of the present disclosure, a wall thickness of the first rib 6331, a wall thickness of the second rib 6332, and a wall thickness of a portion of the first main body portion 631 located between the first rib 6331 and the second rib 6332 are the same. Specifically, each of the first rib 6331 and the second rib 6332 includes a first rib section 633a parallel to the contact portion 621, a second rib section 633b parallel to the tail portion 622, and a third rib section 633c connecting the first rib section 633a and the second rib section 633b. Referring to FIG. 11, the first rib section 633a extends vertically, the second rib section 633b extends horizontally, and the third rib section 633c extends obliquely. The first rib section 633a, the second rib section 633b and the third rib section 633c correspondingly contact the first section 623a, the second section 623b and the third section 623c of the first ground terminal G1 and the second ground terminal G2, respectively.

In addition, the first main body portion 631 further includes a plurality of first protruding pieces 6312 extending downwardly from a bottom edge thereof and a plurality of connecting pieces 6313 each of which is located between two adjacent first protruding pieces 6312. By providing the first protruding pieces 6312, the shielding length can be extended, and the shielding effect on the signal terminals S can be improved. In the illustrated embodiment of the present disclosure, the connecting pieces 6313 are stamped from the first main body portion 631. The connecting piece 6313 straddles the corresponding slot 6231 to connect one side of the first end portion 6232 and the second end portion 6233 of the same first ground terminal G1, thereby improving the shielding effect. At the same time, the connecting piece 6313 can also connect one side of the first end portion 6232 and the second end portion 6233 of the same second ground terminal G2, thereby improving the shielding effect.

In the illustrated embodiment of the present disclosure, there are multiple first extension portions 632 which are disposed at intervals. The first extension portions 632 are used to be inserted into the first slots 6612 and the second slots 6632 of the metal shield surrounding member 66 to achieve contact and improve the shielding effect.

Figure 12:
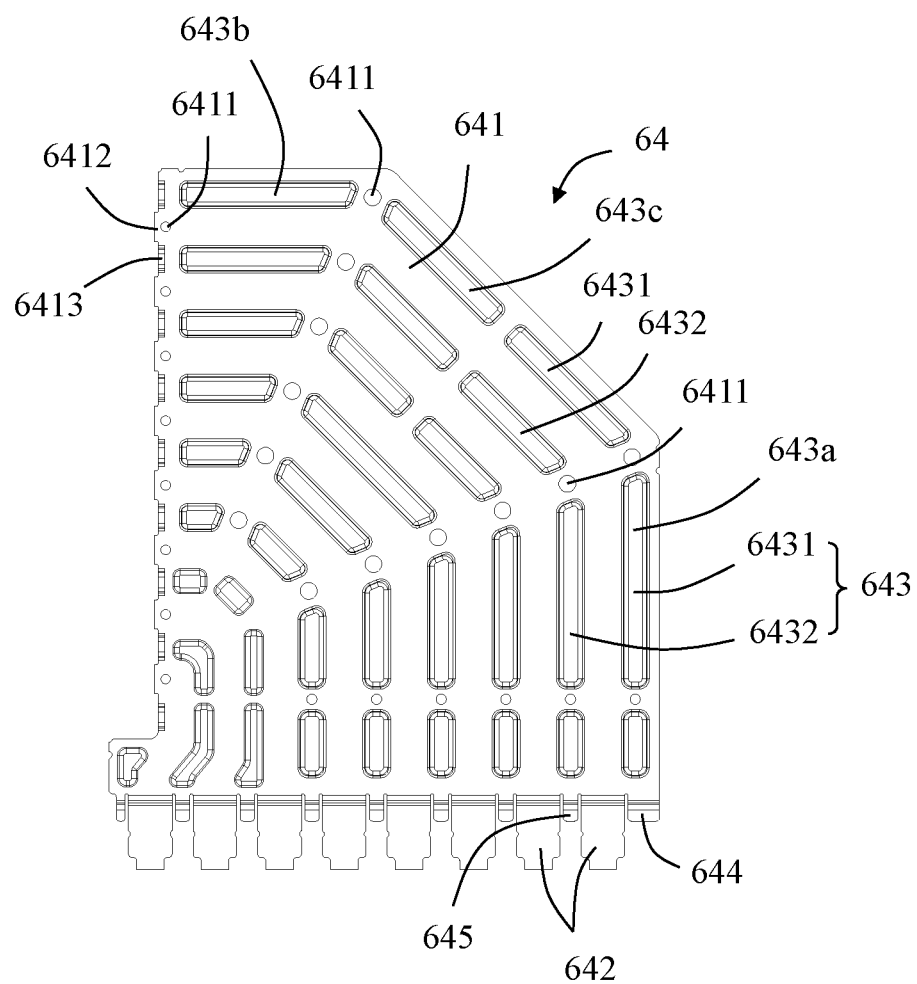
FIG. 12 is a side view of the second metal shield of the backplane connector.

Similarly, referring to FIGS. 10 and 12, the second metal shield 64 includes a second main body portion 641, a second extension portion 642 extending from the second main body portion 641, and a third elastic arm 644 and a fourth elastic arm 645 which are respectively located on both sides of the second extension portion 642. The third elastic arm 644 and the fourth elastic arm 645 extend beyond the second main body portion 641 to contact the first ground terminal G1 and the second ground terminal G2, respectively. The second main body portion 641 is located on the other side of the connection portion 623 of the conductive terminal 62. In the illustrated embodiment of the present disclosure, the second extension portion 642 and the second main body portion 641 are located in different planes, in which the second extension portion 642 is farther away from the first metal shield 63 than the second main body portion 641. The second main body portion 641 includes a plurality of second mounting holes 6411 for mating with the plurality of second posts 6162. The second posts 6162 are fixed and positioned in the second mounting holes 6411 by soldering. The second main body portion 641 includes a plurality of ribs 643. The ribs 643 include a plurality of third ribs 6431 protruding toward the first ground terminal G1 and a plurality of fourth ribs 6432 protruding toward the second ground terminal G2. The third ribs 6431 are disposed along the extending direction of the connection portion 623 of the first ground terminal G1. The fourth ribs 6432 are disposed along the extending direction of the connection portion 623 of the second ground terminal G2. In the illustrated embodiment of the present disclosure, the third ribs 6431 and the fourth ribs 6432 are formed by stamping the second main body portion 641. The third ribs 6431 and the fourth ribs 6432 protrude toward the first metal shield 63. The third ribs 6431 and the fourth ribs 6432 are disposed discontinuously along the extending direction of the connection portion 623 of the first ground terminal G1 and the extending direction of the connection portion 623 of the second ground terminal G2, respectively, so as to achieve multi-position contact. Therefore, the contact reliability between the second metal shield 64 and the first ground terminals G1 and the second ground terminals G2 is improved. In the illustrated embodiment of the present disclosure, a wall thickness of the third rib 6431, a wall thickness of the fourth rib 6432, and a wall thickness of a portion of the second main body portion 641 located between the third rib 6431 and the fourth rib 6432 are the same. Specifically, each of the third rib 6431 and the fourth rib 6432 includes a fourth rib section 643a parallel to the contact portion 621, a fifth rib section 643b parallel to the tail portion 622, and a six rib section 643c connecting the fourth rib section 643a and the fifth rib section 643b. Referring to FIG. 12, the fourth rib section 643a extends vertically, the fifth rib section 643b extends horizontally, and the sixth rib section 643c extends obliquely. The fourth rib section 643a, the fifth rib section 643b and the sixth rib section 643c correspondingly contact the first section 623a, the second section 623b and the third section 623c of the first ground terminal G1 and the second ground terminal G2, respectively.

In an embodiment of the present disclosure, soldering is performed on the surfaces of the ribs 633 and the ribs 643 to solder the ribs 633 and the ribs 643 to the first ground terminals G1 and the second ground terminals G2. For example, soldering is performed on the surfaces of the first ribs 6331, the second ribs 6332, the third ribs 6431 and the fourth ribs 6432 so that the first ribs 6331, the second ribs 6332, the third ribs 6431 and the fourth ribs 6432 are soldered to the first ground terminals G1 and the second ground terminals G2. The soldering method is at least one of spot soldering, laser soldering and ultrasonic soldering.

In addition, the second main body portion 641 further includes a plurality of fourth protruding pieces 6412 extending downwardly from a bottom edge thereof, and a plurality of connecting pieces 6413 each of which is located between two adjacent fourth protruding pieces 6412. By providing the fourth protruding pieces 6412, the shielding length can be extended, and the shielding effect on the signal terminals S can be improved. In the illustrated embodiment of the present disclosure, the connecting pieces 6413 is stamped from the second main body portion 641. The connecting piece 6413 straddles the corresponding slot 6231 to connect the first end 6232 and the other side of the second end 6233 of the same first ground terminal G1 so as to improve the shielding effect. At the same time, the connecting piece 6413 can also connect the first end portion 6232 and the other side of the second end portion 6233 of the same second ground terminal G2 so as to improve the shielding effect.

In the illustrated embodiment of the present disclosure, there are multiple second extension portions 642 which are disposed at intervals. The second extension portions 642 are used to be inserted into the first slots 6612 and the second slots 6632 of the metal shield surrounding member 66 so as to achieve contact and improve the shielding effect.

Referring to FIG. 15, in the length of the connection portion 623 of the conductive terminal 62, the first rib 6331 of the first metal shield 63 and the third rib 6431 of the second metal shield 64 are in contact with two opposite side surfaces of the connection portion 623 of the first ground terminal G1, respectively. The second rib 6332 of the first metal shield 63 and the fourth rib 6432 of the second metal shield 64 are in contact with two opposite side surfaces of the connection portion 623 of the second ground terminal G2, respectively. As a result, a shielding cavity 67 surrounding the outer periphery of the connection portion 623 of each pair of differential signal terminals is formed. In the illustrated embodiment of the present disclosure, the first rib 6331 and the third rib 6431 contact the first wide surface 621*a* of the connection portion 623 of the first ground terminal G1, respectively. The second rib 6332 and the fourth rib 6432 contact the second wide surface 621*c* of the connection portion 623 of the second ground terminal G2, respectively. In the illustrated embodiment of the present disclosure, the shielding cavity 67 is formed by the first main body portion 631, the second main body portion 641, the first ground terminal G1 and the second ground terminal G2. The connection portion 623 of the first ground terminal G1 includes a first tab portion 6234 extending into the shielding cavity 67. The connection portion 623 of the second ground terminal G2 includes a second tab portion 6235 extending into the shielding cavity 67. The connection portions 623 of the differential signal terminals are located between the first tab portion 6234 and the second tab portion 6235. In the illustrated embodiment of the present disclosure, there are a plurality of shielding cavities 67 which are disposed along an arrangement direction of each group of the conductive terminals 62. Two adjacent shielding cavities 67 share a single first ground terminal G1 or a single second ground terminal G2. Taking the shared first ground terminal G1 as an example, a part of the shared first ground terminal G1 protrudes into one shielding cavity 67, and another part of the shared first ground terminal G1 protrudes into another shielding cavity 67.

At a position adjacent to the contact portion 621 of the conductive terminal 62, the first extension portion 632 and the second extension portion 642 are both inserted into the first slot 6612 and the second slot 6632 of the metal shield surrounding member 66. The first extension piece 6611 and the second extension piece 6631 of the metal shield surrounding member 66 are respectively inserted into the first notch 6216 of the first ground terminal G1 and the second notch 6217 of the second ground terminal G2. At the same time, the first elastic arm 634 of the first metal shield 63 and the third elastic arm 644 of the second metal shield 64 clamp both sides of the contact portion 621 of the first ground terminal G1. The second elastic arm 635 of the first metal shield 63 and the fourth elastic arm 645 of the second metal shield 64 clamp both sides of the contact portion 621 of the second ground terminal G2. Specifically, the first elastic arm 634 and the third elastic arm 644 clamp the first wide surface 621*a* of the first ground terminal G1. The second elastic arm 635 and the fourth elastic arm 645 clamp the second wide surface 621*c* of the second ground terminal G2. With this arrangement, the first metal shield 63, the second metal shield 64, the metal shield surrounding member 66, the first ground terminal G1, and the second ground terminal G2 are all connected in series, thereby the shielding area is increased and the shielding effect is improved.

In the illustrated embodiment of the present disclosure, there are multiple terminal modules 6 of the backplane connector 200, and the terminal arrangement of two adjacent terminal modules 6 are staggered. Correspondingly, the shielding cavities 67 of two adjacent terminal modules 6 are also staggered. When the terminal module 6 is assembled to the header 5, the metal shield surrounding member 66 of the terminal module 6 passes through the corresponding terminal receiving grooves 511 so as to extend into the receiving space 535.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A terminal module, comprising:
  a plurality of conductive terminals, each conductive terminal comprising a contact portion and a connection portion electrically connected to the contact portion, the conductive terminals comprising differential signal terminals, a first ground terminal and a second ground terminal; the differential signal terminals being located between the first ground terminal and the second ground terminal, the differential signal terminals comprising a first signal terminal and a second signal terminal; and
  an insulating frame, the connection portions of the conductive terminals being fixed to the insulating frame, the insulating frame comprising a hollow portion to which the connection portions of the conductive terminals are partially exposed, the contact portions of the differential signal terminals protruding beyond the insulating frame;

wherein the contact portion of the first signal terminal comprises a first contact arm, a second contact arm opposite to the first contact arm, and a first clamping space located between the first contact arm and the second contact arm; the first contact arm comprises a first contact end portion and a first contact arm body portion connected with the first contact end portion; the first contact arm body portion comprises a first end connected to the first contact end portion and a second end disposed opposite to the first end; and wherein from the first end to the second end, a width of the first contact arm body portion gradually increases.

2. The terminal module according to claim 1, wherein the first contact arm comprises a limiting block extending from the first contact end portion to at least one side.

3. The terminal module according to claim 1, wherein the first contact arm comprises a first arc-shaped surface located on an inner side of the first contact arm, the second contact arm comprises a second arc-shaped surface located on an inner side of the second contact arm, and the first clamping space is located between the first arc-shaped surface and the second arc-shaped surface.

4. The terminal module according to claim 1, wherein the first contact arm and the second contact arm are disposed symmetrically.

5. The terminal module according to claim 1, wherein the contact portion of the first signal terminal and the contact portion of the second signal terminal are disposed symmetrically.

6. The terminal module according to claim 1, wherein the conductive terminal comprises a transition portion connected to the contact portion, and the transition portion is electrically connected to the connection portion; and wherein the first contact arm and the second contact arm are formed by bending opposite edges of the transition portion of the first signal terminal to a same side.

7. The terminal module according to claim 1, wherein the terminal module comprises an insulating block sleeved on the contact portion of the first signal terminal and the contact portion of the second signal terminal, and a metal shield surrounding member sleeved on the insulating block.

8. The terminal module according to claim 1, wherein the terminal module comprises a first metal shield located on one side of the insulating frame and a second metal shield located on the other side of the insulating frame; the first metal shield comprises a first main body portion located on one side of the connection portions of the conductive terminals; the second metal shield comprises a second main body portion located on the other side of the connection portions of the conductive terminals;

wherein the first main body portion comprises a first rib protruding toward the first ground terminal and a second rib protruding toward the second ground terminal;

wherein the second main body portion comprises a third rib protruding toward the first ground terminal and a fourth rib protruding toward the second ground terminal;

wherein the first rib and the third rib are respectively in contact with opposite side surfaces of the connection portion of the first ground terminal, and the second rib and the fourth rib are respectively in contact with opposite side surfaces of the connection portion of the second ground terminal; and wherein the first main body portion, the second main body portion, the first ground terminal and the second ground terminal are enclosed to form a shielding cavity enclosing the connection portions of the differential signal terminals.

9. The terminal module according to claim 8, wherein the connection portion of the first ground terminal comprises a first tab portion extending into the shielding cavity, the connection portion of the second ground terminal comprises a second tab portion extending into the shielding cavity, and the connection portions of the differential signal terminals are located between the first tab portion and the second tab portion.

10. A backplane connector, comprising:
a header defining a receiving space for receiving a mating backplane connector; and
a plurality of terminal modules assembled to the header, each terminal module comprising:
a plurality of conductive terminals, each conductive terminal comprising a contact portion and a connection portion electrically connected to the contact portion, the conductive terminals comprising differential signal terminals, a first ground terminal and a second ground terminal; the differential signal terminals being located between the first ground terminal and the second ground terminal, the differential signal terminals comprising a first signal terminal and a second signal terminal; and
an insulating frame, the connection portions of the conductive terminals being fixed to the insulating frame, the insulating frame comprising a hollow portion to which the connection portions of the conductive terminals are partially exposed, the contact portions of the differential signal terminals protruding beyond the insulating frame;
wherein the contact portion of the first signal terminal comprises a first contact arm, a second contact arm opposite to the first contact arm, and a first clamping space located between the first contact arm and the second contact arm; the first contact arm comprises a first contact end portion and a first contact arm body portion connected with the first contact end portion; the first contact arm body portion comprises a first end connected to the first contact end portion and a second end disposed opposite to the first end; and from the first end to the second end, a width of the first contact arm body portion gradually increases; and
wherein the contact portions of the conductive terminals protrude into the receiving space.

11. The backplane connector according to claim 10, wherein the first contact arm comprises a limiting block extending from the first contact end portion to at least one side.

12. The backplane connector according to claim 10, wherein the first contact arm comprises a first arc-shaped surface located on an inner side of the first contact arm, the second contact arm comprises a second arc-shaped surface located on an inner side of the second contact arm, and the first clamping space is located between the first arc-shaped surface and the second arc-shaped surface.

13. The backplane connector according to claim 10, wherein the first contact arm and the second contact arm are disposed symmetrically.

14. The backplane connector according to claim 10, wherein the contact portion of the first signal terminal and the contact portion of the second signal terminal are disposed symmetrically.

15. The backplane connector according to claim 10, wherein the conductive terminal comprises a transition portion connected to the contact portion, and the transition portion is electrically connected to the connection portion; and wherein the first contact arm and the second contact arm are formed by bending opposite edges of the transition portion of the first signal terminal to a same side.

16. The backplane connector according to claim 10, wherein the terminal module comprises an insulating block sleeved on the contact portion of the first signal terminal and the contact portion of the second signal terminal, and a metal shield surrounding member sleeved on the insulating block.

17. The backplane connector according to claim 10, wherein the terminal module comprises a first metal shield located on one side of the insulating frame and a second metal shield located on the other side of the insulating frame; the first metal shield comprises a first main body portion located on one side of the connection portions of the conductive terminals; the second metal shield comprises a second main body portion located on the other side of the connection portions of the conductive terminals;

wherein the first main body portion comprises a first rib protruding toward the first ground terminal and a second rib protruding toward the second ground terminal;

wherein the second main body portion comprises a third rib protruding toward the first ground terminal and a fourth rib protruding toward the second ground terminal;

wherein the first rib and the third rib are respectively in contact with opposite side surfaces of the connection portion of the first ground terminal, and the second rib and the fourth rib are respectively in contact with opposite side surfaces of the connection portion of the second ground terminal; and wherein the first main body portion, the second main body portion, the first ground terminal and the second ground terminal are enclosed to form a shielding cavity enclosing the connection portions of the differential signal terminals.

18. The backplane connector according to claim 17, wherein the connection portion of the first ground terminal comprises a first tab portion extending into the shielding cavity, the connection portion of the second ground terminal comprises a second tab portion extending into the shielding cavity, and the connection portions of the differential signal terminals are located between the first tab portion and the second tab portion.

* * * * *